US012690250B2

(12) United States Patent
Lin et al.

(10) Patent No.: US 12,690,250 B2
(45) Date of Patent: Jul. 21, 2026

(54) SEMICONDUCTOR DEVICE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Shih-Yen Lin, New Taipei City (TW); Po-Cheng Tsai, Taichung City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 456 days.

(21) Appl. No.: 18/311,563

(22) Filed: May 3, 2023

(65) Prior Publication Data

US 2024/0371944 A1 Nov. 7, 2024

(51) Int. Cl.
*H10D 62/80* (2025.01)
*H10D 84/01* (2025.01)
*H10D 84/03* (2025.01)
*H10P 14/20* (2026.01)

(52) U.S. Cl.
CPC ....... *H10D 62/882* (2025.01); *H10D 84/0128* (2025.01); *H10D 84/0158* (2025.01); *H10D 84/038* (2025.01); *H10P 14/3406* (2026.01); *H10P 14/3436* (2026.01)

(58) Field of Classification Search
CPC ........ H01L 21/02527; H01L 21/02568; H10D
62/882; H10D 62/883; H10D 84/0128; H10D 84/0158; H10D 84/038; H10P 14/3406; H10P 14/3436
See application file for complete search history.

(56) References Cited

U.S. PATENT DOCUMENTS

| | | | | |
|---|---|---|---|---|
| 2005/0145843 | A1* | 7/2005 | Yin | H10D 30/6215 257/E29.147 |
| 2013/0330885 | A1* | 12/2013 | Chen | H10D 30/021 977/734 |
| 2016/0043235 | A1* | 2/2016 | Lin | H10D 48/01 257/29 |
| 2021/0193801 | A1* | 6/2021 | Wang | H10D 62/149 |

OTHER PUBLICATIONS

Chung et al., "In-Plane Gate Transistors Fabricated by Using Atomic Force Microscopy Anode Oxidation", IEEE Electron Device Letters, vol. 31, No. 11, Nov. 2010, pp. 1227-1229.
Chung et al., "In-Plane Gate Transistors With a 40-μm-Wide Channel Width", IEEE Electron Device Letters, vol. 33, No. 8, Aug. 2012, pp. 1129-1131.

* cited by examiner

*Primary Examiner* — Andres Munoz
(74) *Attorney, Agent, or Firm* — Birch, Stewart, Kolasch & Birch, LLP

(57) ABSTRACT

A semiconductor device includes a substrate. A 2-D material channel layer is over the substrate, in which the 2-D material channel layer includes a channel region and source/drain regions on opposite sides of the channel region. Source/drain metals are over of the source/drain regions of the 2-D material channel layer. A gate metal is over the substrate and non-overlapping the 2-D material channel layer along a vertical direction, in which the gate metal is laterally separated from the 2-D material channel layer by an air gap.

20 Claims, 42 Drawing Sheets

SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
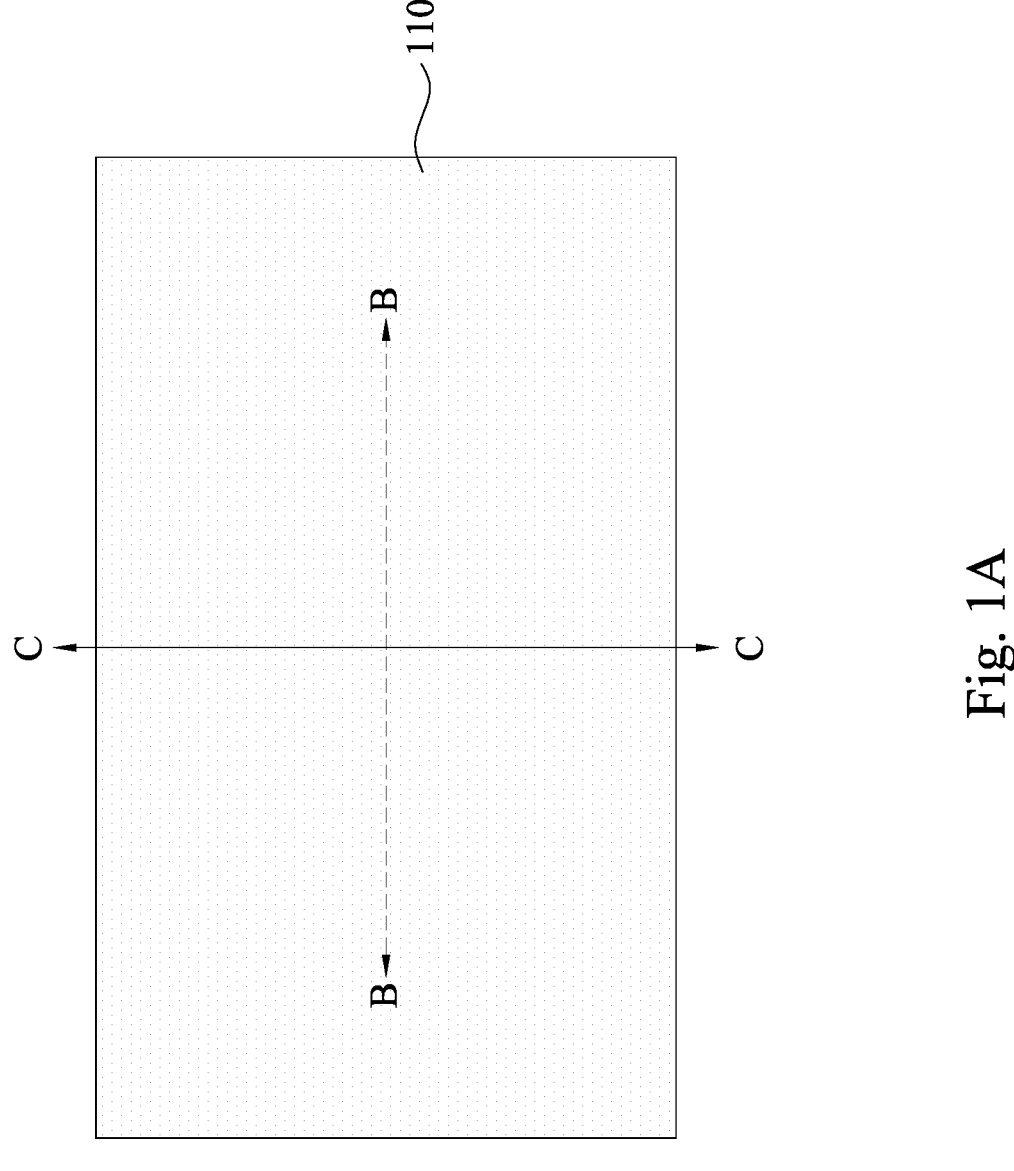
FIGS. 1A to 5C illustrate a semiconductor device in various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 5C illustrate a semiconductor device in various stages of fabrication in accordance with some embodiments of the present disclosure. Although the views shown in FIGS. 1A to 5C are described with reference to a method, it will be appreciated that the structures shown in FIGS. 1A to 5C are not limited to the method but rather may stand alone separate of the method. Although FIGS. 1A to 5C are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 1B:
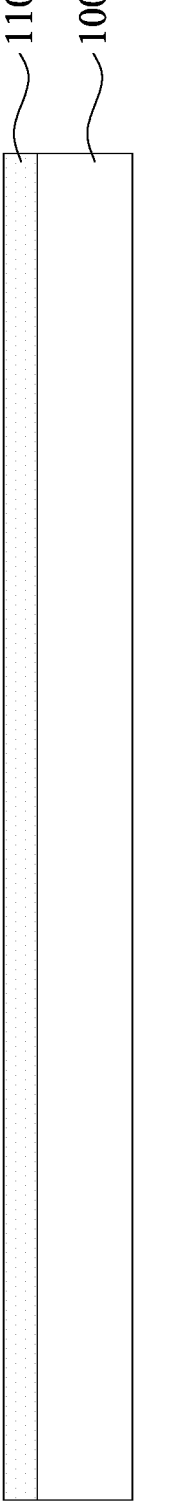
FIG. 1D illustrates a molecular diagram of graphene in accordance with some embodiments of the present disclosure.
Figure 1C:
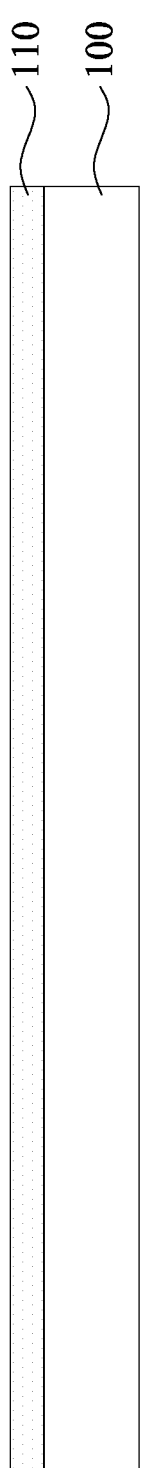

Reference is made to FIGS. 1A to 1C, in which FIG. 1A is a top view of a semiconductor device, FIG. 1B is a cross-sectional view along line B-B of FIG. 1A, and FIG. 1C is a cross-sectional view along line C-C of FIG. 1A. Shown there is a substrate 100. In some embodiments, the substrate 100 may function to provide mechanical and/or structure support for features or structures that are formed in the subsequent steps of the process flow illustrated in FIGS. 1A to 5C. These features or structures may be parts or portions of an integrated circuit (e.g., transistor, interconnect structure, etc.) that may be formed on or over the substrate 100.

Generally, the substrate 100 illustrated in FIGS. 1A to 1C may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates. In some other embodiments, the substrate 100 may include sapphire (e.g. crystalline $Al_2O_3$), e.g. a large grain or a single crystalline layer of sapphire or a coating of sapphire. As another example, the substrate 100 may be a sapphire substrate, e.g. a transparent sapphire substrate comprising, as an example, $\alpha$-$Al_2O_3$. Other elementary semiconductors like germanium may also be used for substrate 100.

A 2-D material layer 110 is formed over the substrate 100. In some embodiments, the 2-D material layer 110 is in direct contact with the top surface of the substrate 100. As used herein, consistent with the accepted definition within solid state material art, a "2-D material" may refer to a crystalline material consisting of a single layer of atoms. As widely accepted in the art, "2-D material" may also be referred to as a "monolayer" material. In this disclosure, "2-D material" and "monolayer" material are used interchangeably without differentiation in meanings, unless specifically pointed out otherwise. The 2-D material layer 110 may be 2-D materials of suitable thickness. In some embodiments, a 2-D material includes a single layer of atoms in each of its monolayer structure, so the thickness of the 2-D material refers to a number of monolayers of the 2-D material, which can be one monolayer or more than one monolayer. The coupling between two adjacent monolayers of 2-D material includes van der Waals forces, which are weaker than the chemical bonds between/among atoms within the single monolayer.

In some embodiments, the 2-D material layer 110 is made of graphene. In some embodiments, the 2-D material layer 110 is made of a single monolayer graphene. In some embodiments, exemplary technique for forming a graphene layer utilizes CVD (chemical vapor deposition) directly on the substrate 100. In some embodiments, the graphene layer may be formed by epitaxial graphene growth. For example, a silicon carbide dielectric is used as a seed layer to promote the epitaxial growth of the graphene on the substrate 100. In some other embodiments, graphene layer may be formed on a backing material (such as an adhesive tape), the backing material can be adhered to the substrate 100. Then, the backing material can be removed while leaving the graphene layer on the substrate 100. In some other embodiments, graphene is formed by reacting a metal film with silicon carbide to form a metal carbide. The metal carbide is annealed to produce a metal silicide and graphene from the remaining carbon. In yet other exemplary embodiments, graphene layer is deposited using an aqueous solution of graphene oxide. In other embodiments, the 2-D material layer 110 can also be made of silicene, germanene, and stanene. In other embodiments, the 2-D material layer 110 can also be made of molybdenum disulfide ($MoS_2$), molybdenum diselenide ($MoSe_2$), tungsten disulfide ($WS_2$), tungsten diselenide ($WSe_2$), or the like.

Figure 1D:
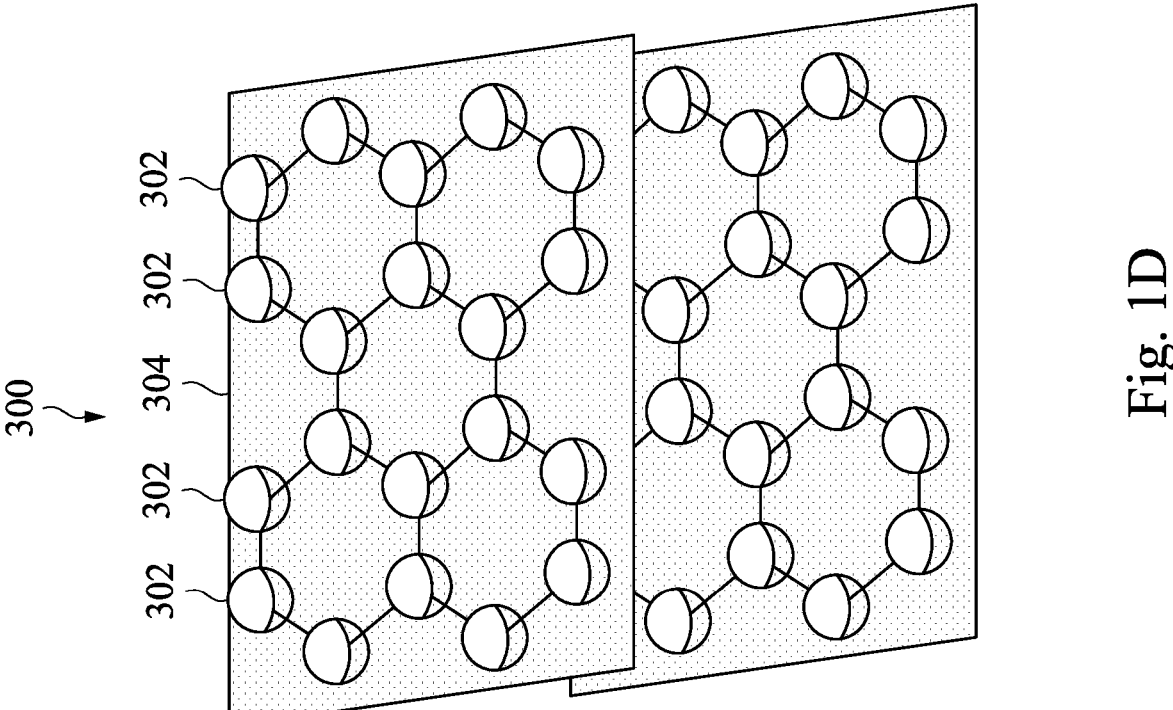

FIG. 1D illustrates a molecular diagram 300 of graphene (e.g., the 2-D material layer 110) according to some embodiments of the present disclosure. Graphene is an arrangement of carbon atoms 302 in mono-layers aligned along a single plane 304. As pure graphene has a high conductivity, it may be doped with one or more impurities to control mobility and induce a semiconductor-like response to a gate voltage. In various embodiments, the graphene may be doped with titanium, chromium, iron, $NH_3$, potassium, and/or $NO_2$.

Figure 2A:
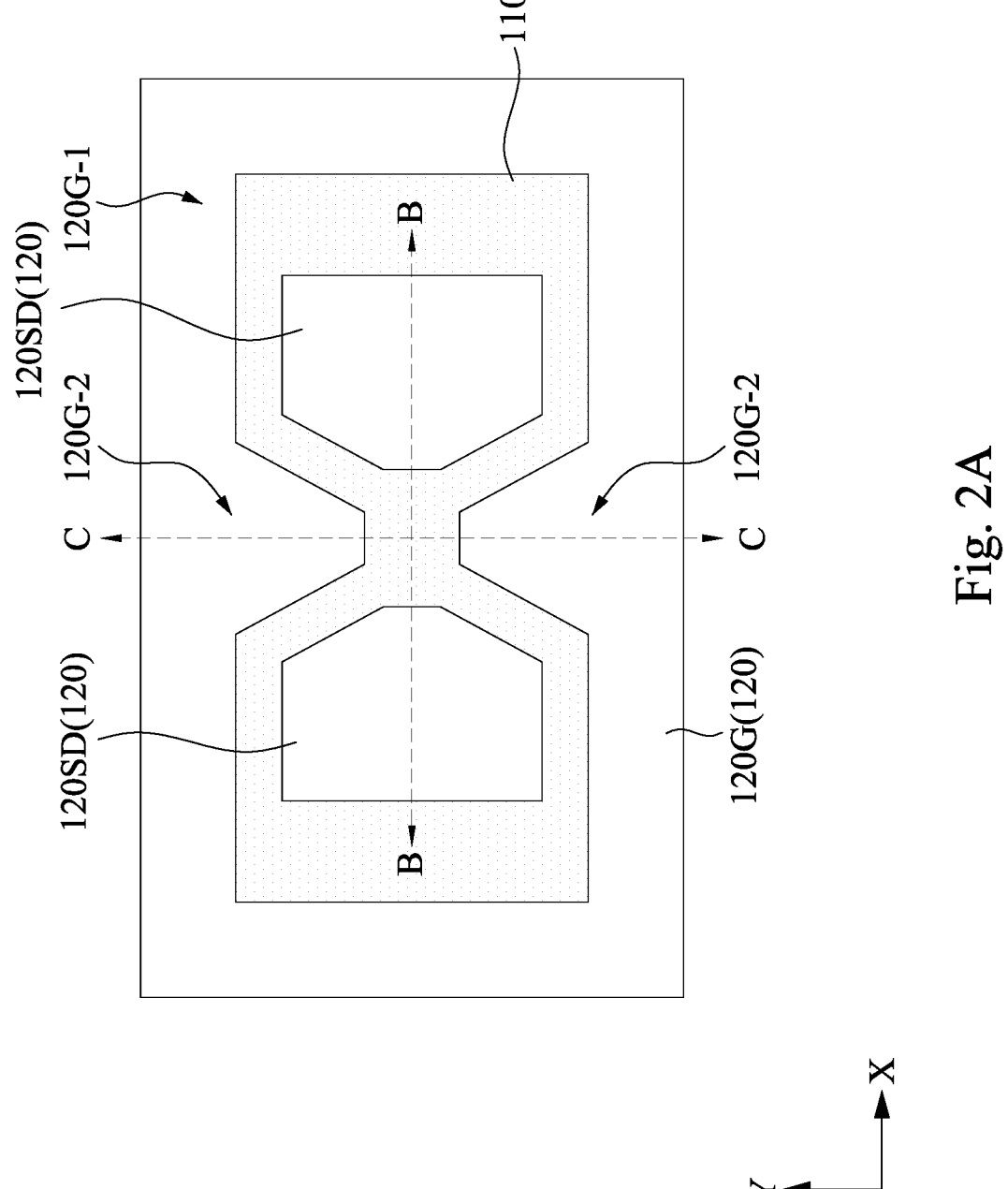
Figures 2B, 2C:
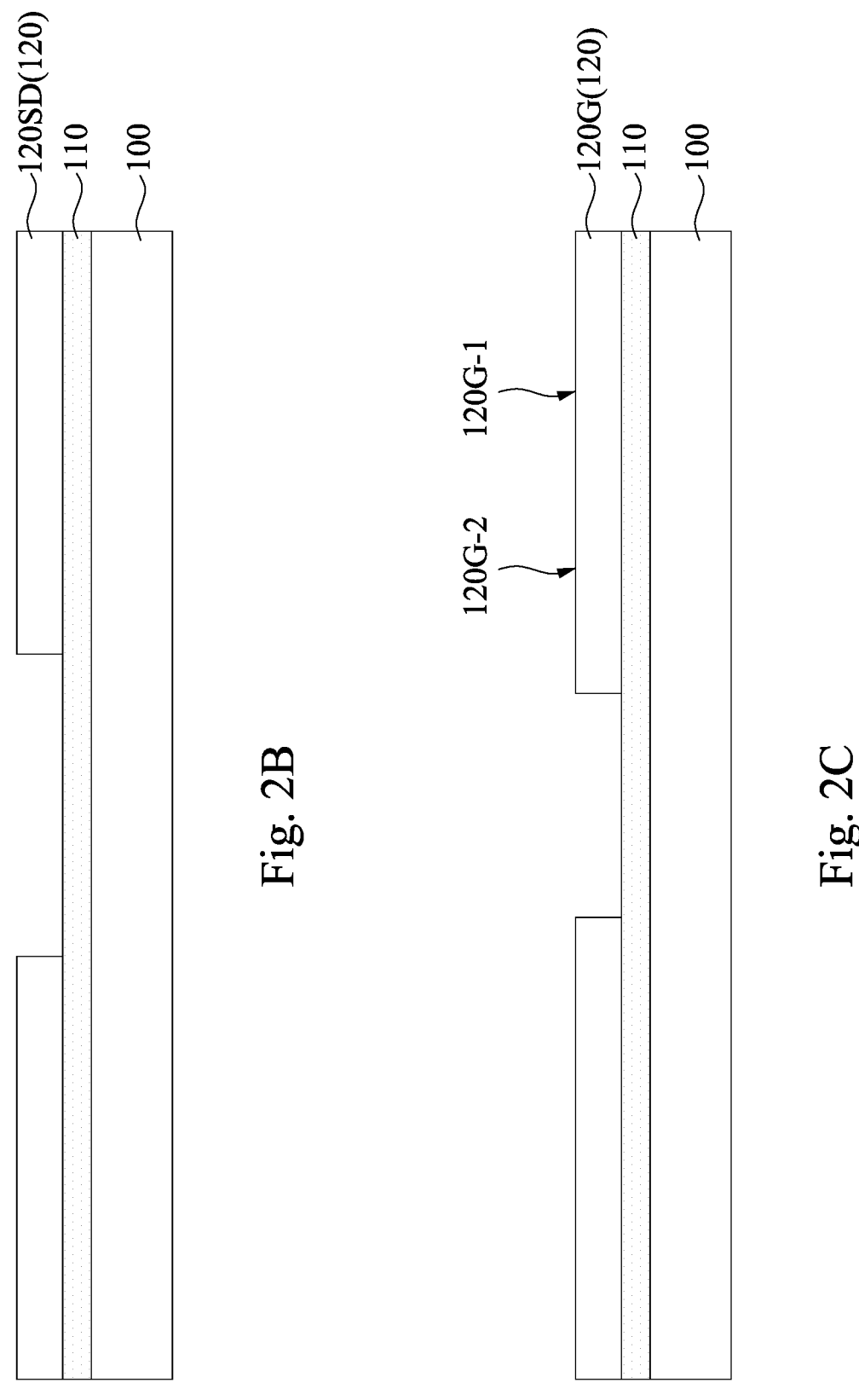

Reference is made to FIGS. 2A to 2C, in which FIG. 2A is a top view of a semiconductor device, FIG. 2B is a cross-sectional view along line B-B of FIG. 2A, and FIG. 2C is a cross-sectional view along line C-C of FIG. 2A. A contact electrode layer 120 is formed over the 2-D material layer 110. The contact electrode layer 120 may include a gate contact electrode 120G and source/drain contact electrodes 120SD. In some embodiments, top surface of the 2-D material layer 110 may be exposed from the gate contact electrode 120G and the source/drain contact electrodes 120SD. In some embodiments, top surface of the gate contact electrode 120G may be level with top surfaces of the source/drain contact electrodes 120SD. In some embodiments, bottom surface of the gate contact electrode 120G may be level with bottom surfaces of the source/drain contact electrodes 120SD.

In greater details, as shown in the top view of FIG. 2A, the gate contact electrode 120G may encloses the source/drain contact electrodes 120SD. For example, the gate contact electrode 120G may include a rectangular ring-shape portion 120G-1 and two extension portions 120G-2 connected to an inner sidewall of the ring-shape portion 120G-1. In some embodiments, the extension portions 120G-2 may extend toward each other along the Y-direction. Stated another way, the extension portions 120G-2 may align with each other along the Y-direction. On the other hand, the source/drain contact electrodes 120SD may align with each other along the X-direction.

In some embodiments, the contact electrode layer 120 may include conductive material, such as metal. Exemplary metal may include copper (Cu), ruthenium (Ru), iridium (Ir), rhodium (Rh), gold (Au), silver (Ag), platinum (Pt), tungsten (W), or other suitable metals. In some embodiments, the contact electrode layer 120 may be made of elemental 2-D material such as antimonene, stanine, or the like.

In some embodiments, the contact electrode layer 120 may be formed by, for example, depositing a conductive layer blanket over the 2-D material layer 110, and then performing a lithography process to pattern the conductive layer according to a pre-determined pattern. In some embodiments, the conductive layer may be deposited using thermal evaporation, e-beam deposition, e-gun evaporation, sputtering, or other suitable deposition methods. In some embodiments, the lithography process may be e-beam lithography, or other suitable lithography processes.

In some other embodiments, the contact electrode layer 120 may be formed by, for example, forming a patterned mask, such as photoresist, over the 2-D material layer 110, in which the patterned mask includes openings which define the positions and profiles of the contact electrode layer 120. A conductive layer is deposited over the patterned mask and filling the openings of the patterned mask. Then, the patterned mask is removed through a suitable process (e.g., a lift-off process), and the portions of the conductive layer in the openings of the patterned mask remain over the 2-D material layer 110 and serve as the contact electrode layer 120.

Figure 3A:
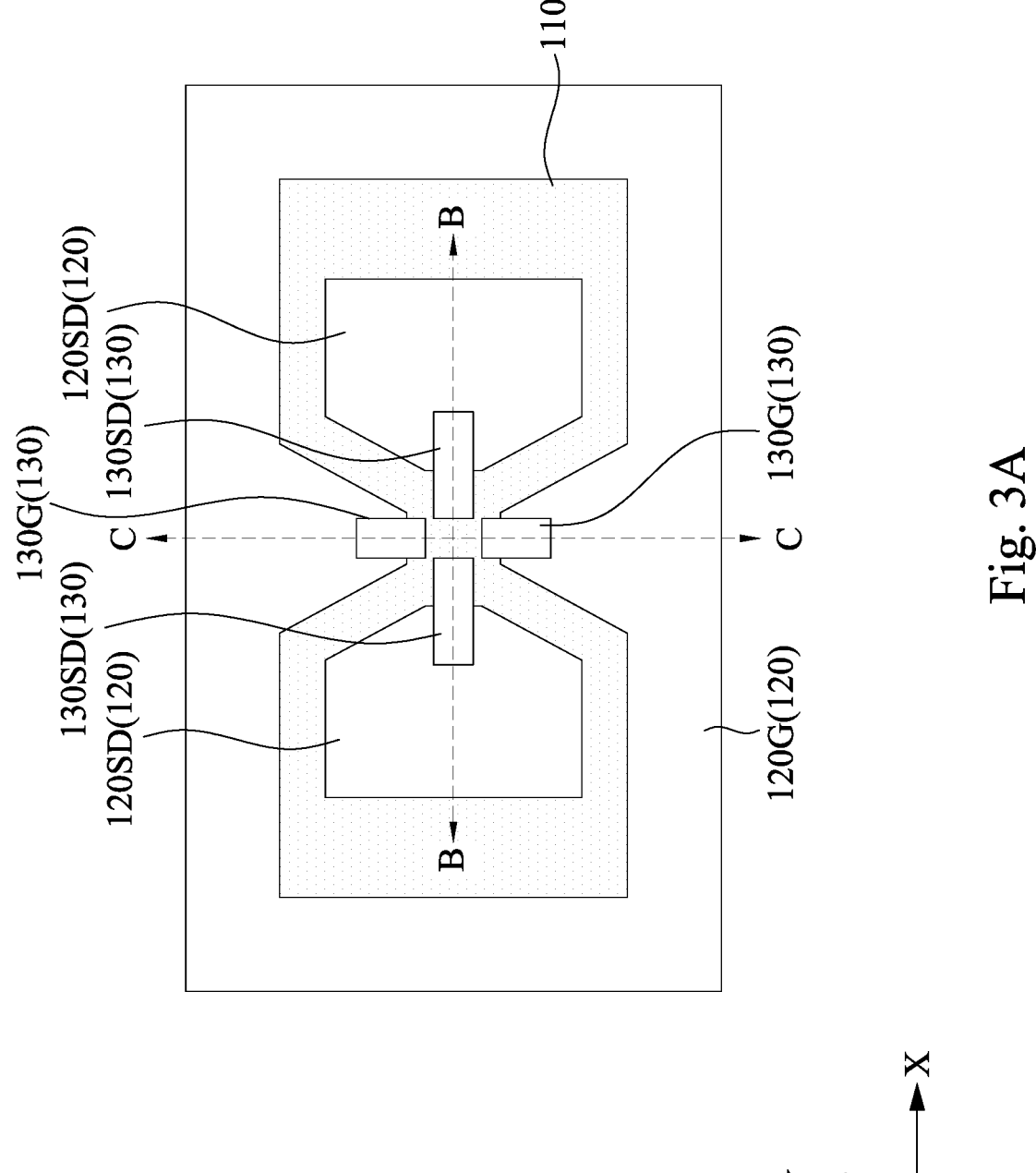
Figures 3B, 3C:
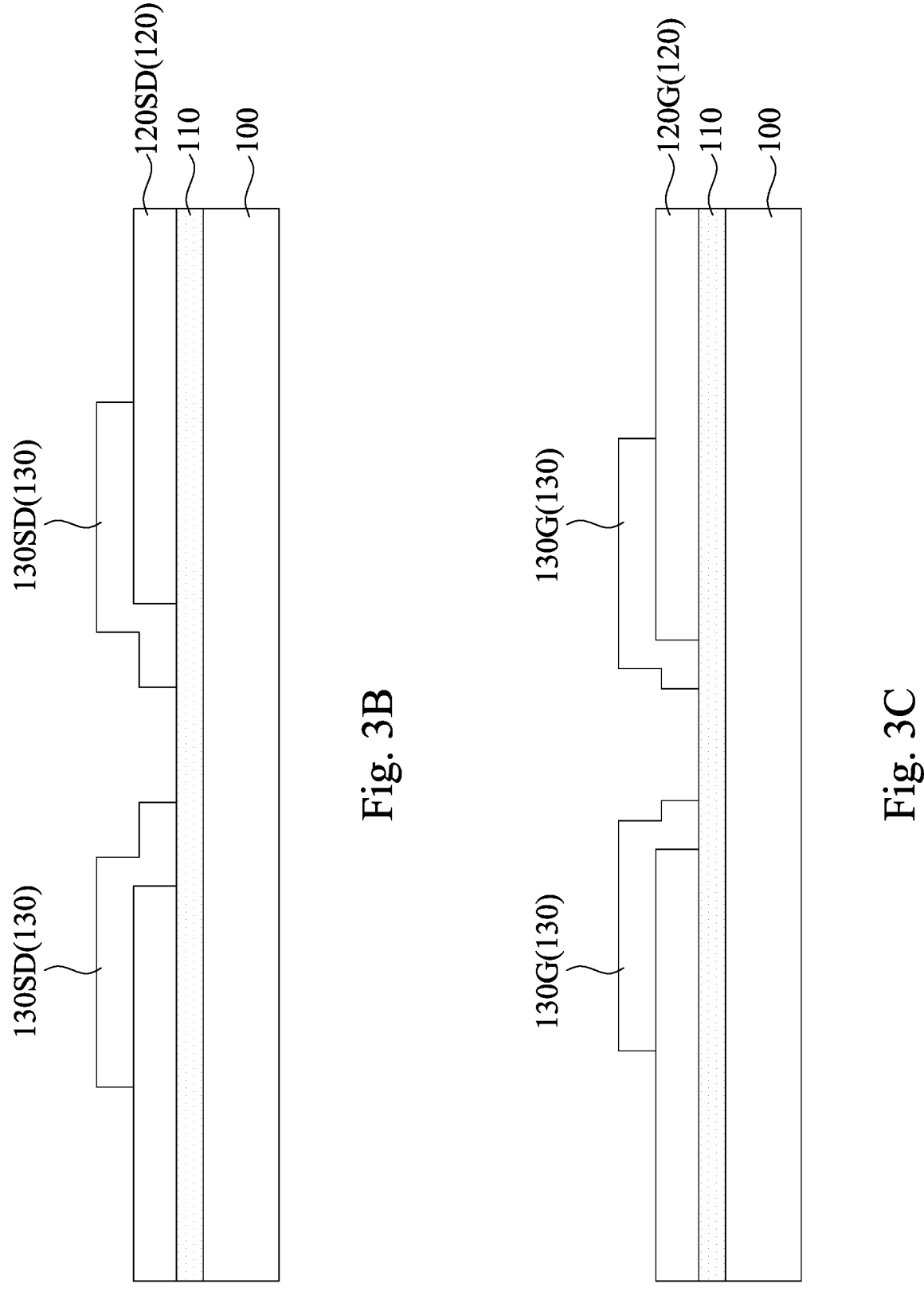

Reference is made to FIGS. 3A to 3C, in which FIG. 3A is a top view of a semiconductor device, FIG. 3B is a cross-sectional view along line B-B of FIG. 3A, and FIG. 3C is a cross-sectional view along line C-C of FIG. 3A. A metal layer 130 is formed over the substrate 100 and covering portions of the 2-D material layer 110 and the contact electrode layer 120. In some embodiments, the metal layer 130 may include gate metals 130G and source/drain metals 130SD. In some embodiments, top surfaces of the gate metals 130G may be level with top surfaces of the source/drain metal 130SD. In some embodiments, bottom surfaces of the gate metals 130G may be level with bottom surfaces of the source/drain metal 130SD.

As shown in FIG. 3A, with respect to the source/drain metals 130SD, the source/drain metals 130SD may extend along the X-direction, and may align with each other along the X-direction. Moreover, the width of each source/drain metal 130SD along the Y-direction is less than the maximal width of the corresponding source/drain contact electrode 120SD along the Y-direction. In some embodiments, the shortest distance between the source/drain metals 130SD along the X-direction is less than the shortest distance between the source/drain contact electrodes 120SD along the X-direction.

As shown in FIG. 3B, with respect to the source/drain metals 130SD, each of the source/drain metals 130SD may extend from top surface of a corresponding source/drain contact electrode 120SD, through sidewall of the corresponding source/drain contact electrode 120SD, to top surface of the 2-D material layer 110. Accordingly, each of the source/drain metals 130SD may include a stepped top surface profile and a stepped bottom surface profile.

As shown in FIG. 3A, with respect to the gate metals 130G, the gate metals 130G may extend along the Y-direction, and may align with each other along the Y-direction. Moreover, the width of each gate metals 130G along the X-direction is less than the maximal width of the corresponding extension portion 120G-2 of the gate contact electrode 120G along the X-direction. In some embodiments, the shortest distance between the gate metals 130G along the Y-direction is less than the shortest distance between the extension portions 120G-2 of the gate contact electrode 120G along the Y-direction.

As shown in FIG. 3C, with respect to the gate metals 130G, each of the gate metals 130G may extend from top surface of a corresponding extension portion 120G-2 of the gate contact electrode 120G, through sidewall of the corresponding extension portion 120G-2 of the gate contact electrode 120G, to top surface of the 2-D material layer 110. Accordingly, each of the gate metals 130G may include a stepped top surface profile and a stepped bottom surface profile.

In some embodiments, the metal layer 130 may include conductive material, such as metal. Exemplary metal may include copper (Cu), ruthenium (Ru), iridium (Ir), rhodium (Rh), gold (Au), silver (Ag), platinum (Pt), tungsten (W), or other suitable metals.

In some embodiments, the metal layer 130 may be formed by, for example, depositing a conductive layer blanket over the substrate 100 and covering the 2-D material layer 110 and the contact electrode layer 120, and then performing a lithography process to pattern the conductive layer according to a pre-determined pattern. In some embodiments, the conductive layer may be deposited using thermal evaporation, e-beam deposition, e-gun evaporation, sputtering, or other suitable deposition methods. In some embodiments, the lithography process may be e-beam lithography, or other suitable lithography processes.

In some other embodiments, the metal layer 130 may be formed by, for example, forming a patterned mask, such as photoresist, covering the 2-D material layer 110 and the contact electrode layer 120, in which the patterned mask includes openings which define the positions and profiles of the metal layer 130. A conductive layer is deposited over the patterned mask and filling the openings of the patterned mask. Then, the patterned mask is removed through a suitable process (e.g., a lifting process), and the portions of the conductive layer in the openings of the patterned mask remain over the 2-D material layer 110 and the contact electrode layer 120 and serve as the metal layer 130.

Figure 4A:
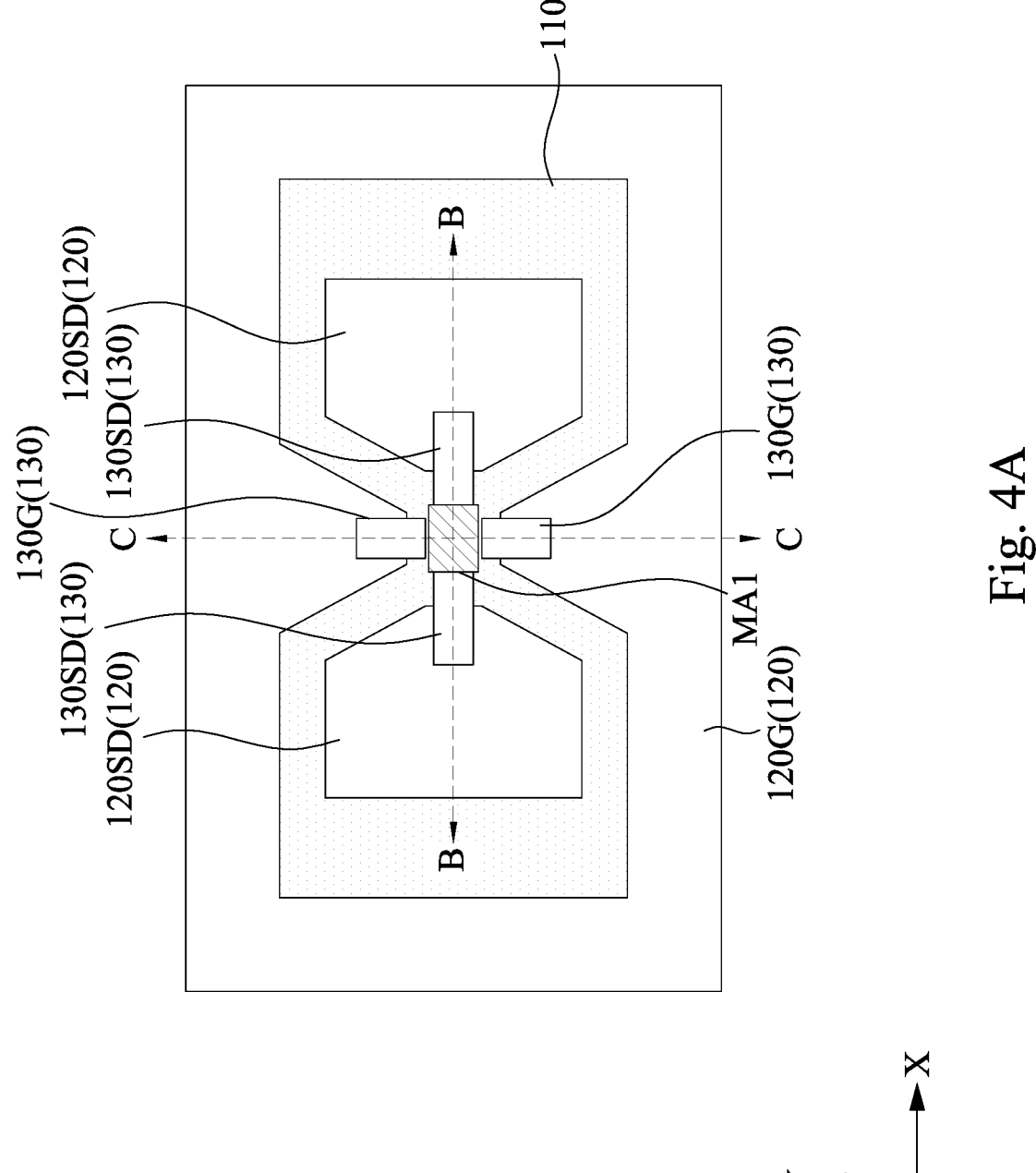
Figures 4B, 4C:
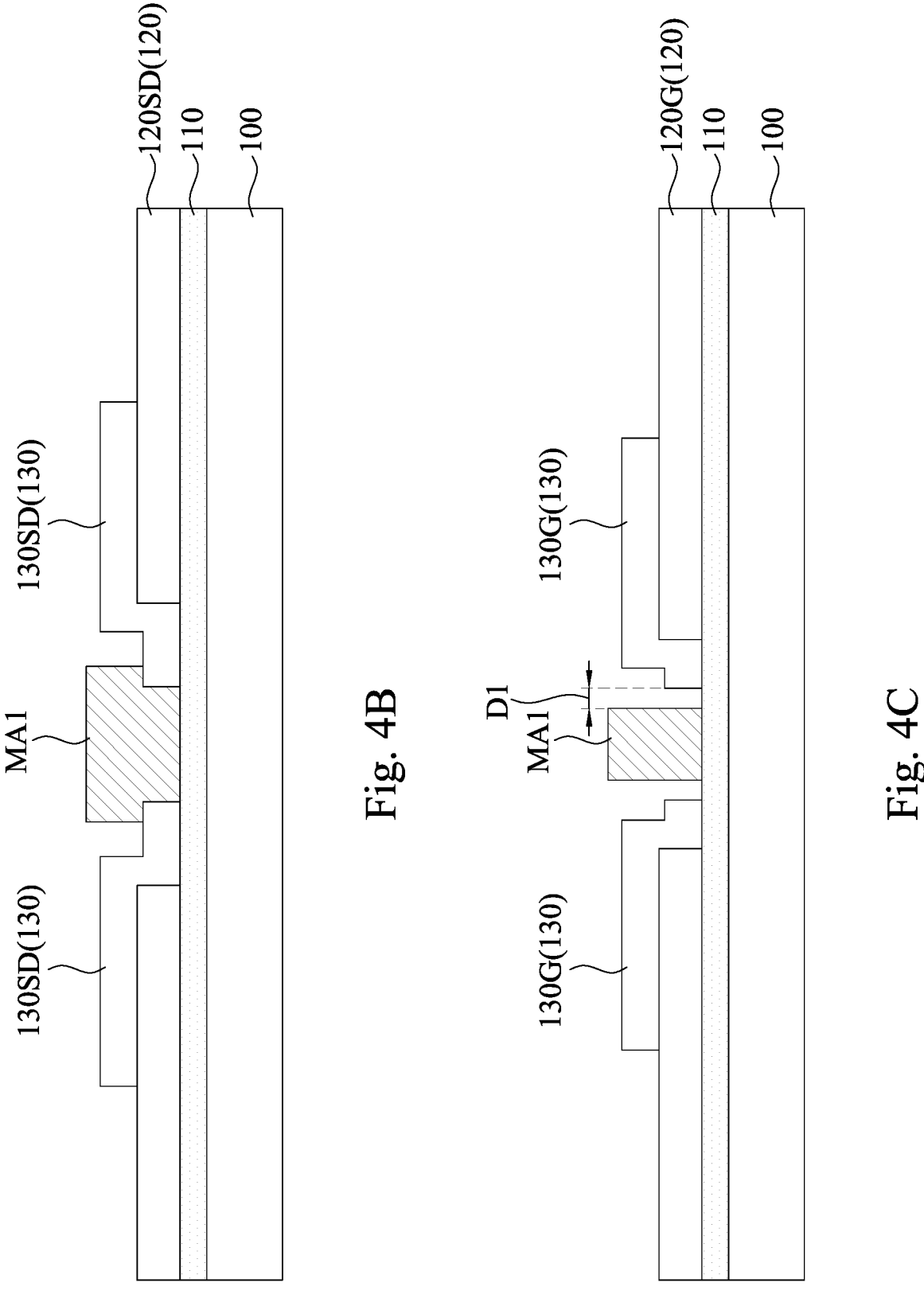

Reference is made to FIGS. 4A to 4C, in which FIG. 4A is a top view of a semiconductor device, FIG. 4B is a cross-sectional view along line B-B of FIG. 4A, and FIG. 4C is a cross-sectional view along line C-C of FIG. 4A. A patterned mask MA1 is formed over the substrate 100 and covering portions of the metal layer 130 and the 2-D material layer 110.

As shown in the cross-section view of FIG. 4B, the patterned mask MA1 is in contact with top surface of the 2-D material layer 110. Moreover, the patterned mask MA1 is in contact with top surface of the source/drain metals 130SD and sidewalls of the source/drain metals 130SD. In some embodiments, the patterned mask MA1 may vertically overlap portions of the source/drain metals 130SD. However, the patterned mask MA1 may not overlap the source/drain contact electrodes 120SD. That is, the patterned mask MA1 may be laterally separated from the source/drain contact electrodes 120SD by a non-zero distance.

As shown in the cross-section view of FIG. 4C, the patterned mask MA1 is in contact with top surface of the 2-D material layer 110. However, the patterned mask MA1 may not overlap the gate metals 130G and the gate contact electrode 120G. That is, the patterned mask MA1 may be laterally separated from the gate metals 130G and the gate contact electrode 120G by a non-zero distance. In FIG. 4C, the lateral distance D1 (along the Y-direction) between the patterned mask MA1 and each gate metal 130G is in a range from about 1 nm to 300 nm. The lateral distance D1 is tuned to achieve desired device performance, which will be discussed later.

In some embodiments, the patterned mask MA1 may be a photoresist layer. In some embodiments, the photoresist layer may be formed by spinning, spray coating, or other applicable techniques. The photoresist layer may include a light sensitive material such that properties, such as solubility, of the photoresist layer are affected by light.

Figure 5A:
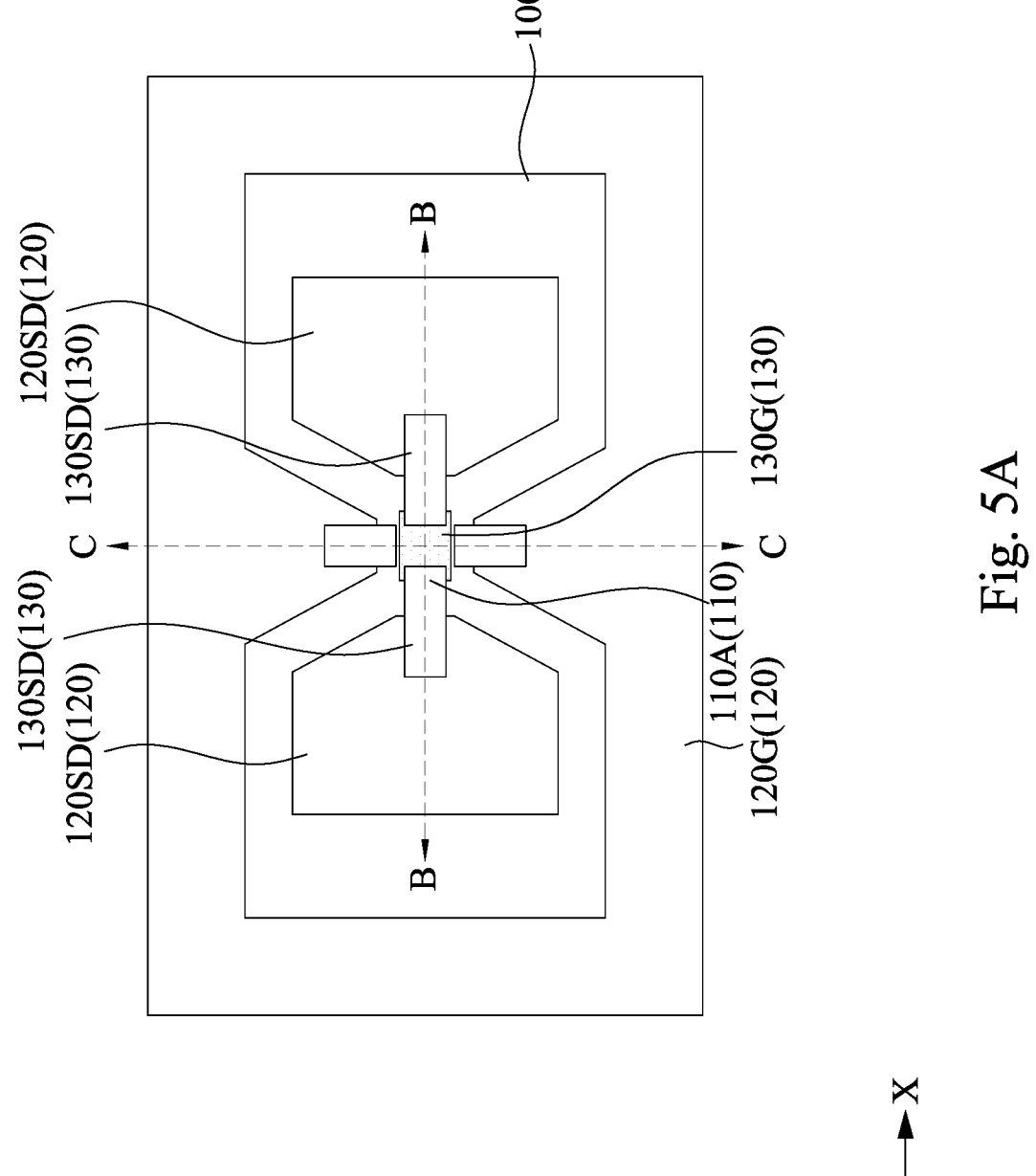
Figures 5B, 5C:
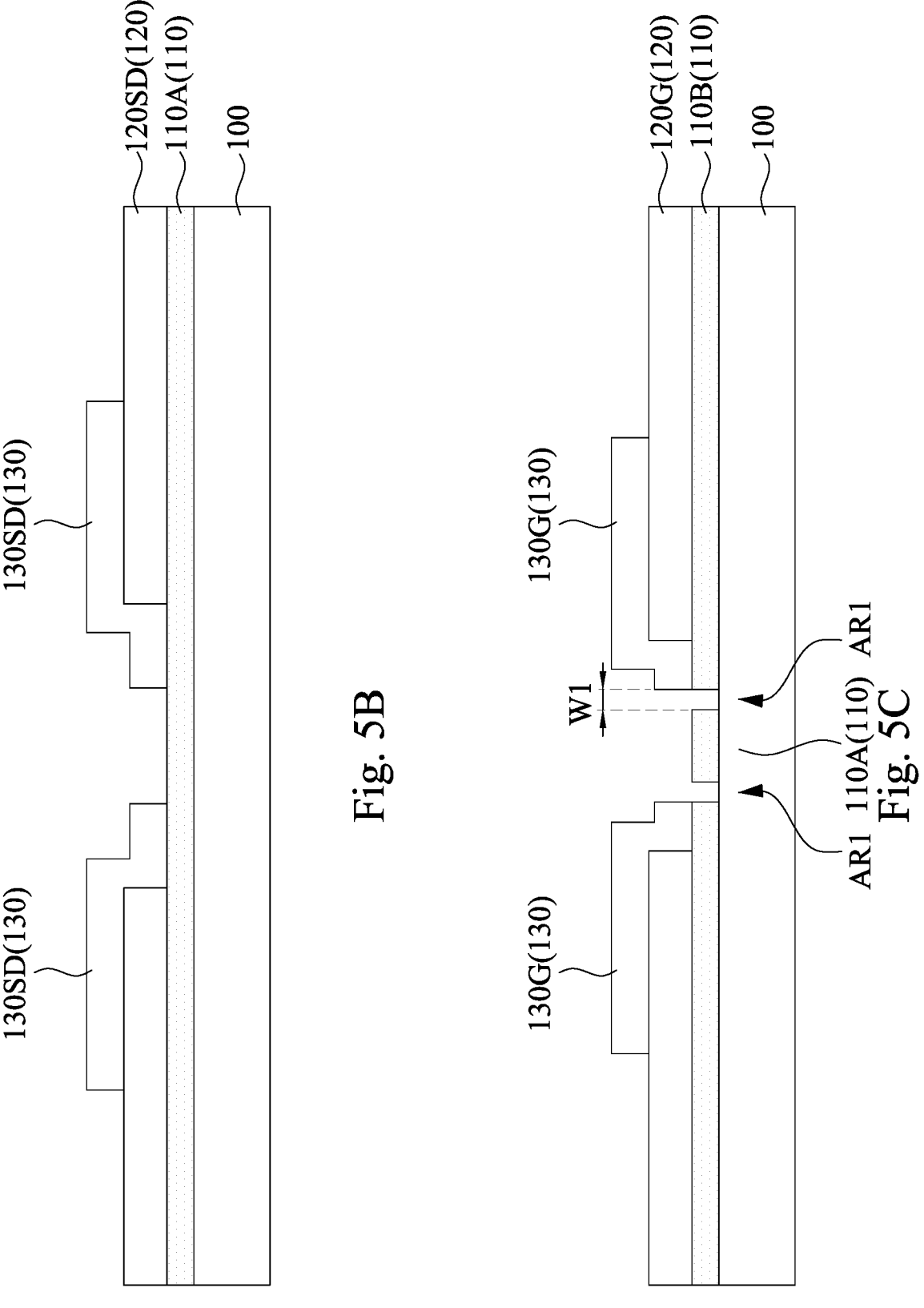

Reference is made to FIGS. 5A to 5C, in which FIG. 5A is a top view of a semiconductor device, FIG. 5B is a cross-sectional view along line B-B of FIG. 5A, and FIG. 5C is a cross-sectional view along line C-C of FIG. 5A. An etching process is performed to remove portions of the 2-D material layer 110 that are exposed by the patterned mask MA1, the metal layer 130, and the contact electrode layer 120. After the etching process is completed, the patterned mask MA1 is removed.

In some embodiments, the etched 2-D material layer 110 may include a remaining portion 110A and a remaining portion 110B, in which the remaining portion 120A is spatially separated from the remaining portion 110B. The remaining portions 110A and 110B of the 2-D material layer 110 can also be referred to as 2-D material layers 110A and 110B. In FIG. 5B, the 2-D material layer 110A is covered at least in part by the source/drain metals 130SD and the source/drain contact electrodes 120SD, and a portion of the 2-D material layer 110A is exposed by the source/drain metals 130SD and the source/drain contact electrodes 120SD. On the other hand, in FIG. 5C, the 2-D material layer 110B is under the gate contact electrode 120G and the gate metals 130G. In some embodiments, an entirety of the 2-D material layer 110B is under the gate contact electrode 120G and the gate metals 130G. In some embodiments, the 2-D material layer 110A is free of coverage by the gate contact electrode 120G and the gate metals 130G. That is, the gate contact electrode 120G and the gate metals 130G do not vertically overlap the 2-D material layer 110A.

In some embodiments, the gate metals 130G, the source/ drain metals 130SD, and the 2-D material layer 110A may collectively serve as a transistor. The transistor is an in-plane gate transistor (IPGT). The 2-D material layer 110A may act as a channel layer of the transistor, and can also be referred to as a 2-D material channel layer. In some embodiments, the portion of the 2-D material layer 110A under the source/ drain metals 130SD (and/or under the source/drain contact electrode 120SD) can be referred to as source/drain regions of the 2-D material layer 110A. On the other hand, the portion of the 2-D material layer 110A exposed by the source/drain metals 130SD (and/or exposed by the source/ drain contact electrode 120SD) can be referred to as channel region of the 2-D material layer 110A.

As shown in FIGS. 5A and 5C, air gaps AR1 may present between the channel region of the 2-D material layer 110A and the corresponding one of the gate metals 130G. In some embodiments, the air gaps AR1 can act as gate dielectric layers of the transistor, which laterally separate the channel region of the 2-D material layer 110A from the gate metals 130G. The lateral width W1 of the air gap AR1 (along the Y-direction) between the channel region of the 2-D material layer 110A and the corresponding gate metals 130G is in a range from about 1 nm to about 300 nm. In some embodiments, the lateral width W1 of each air gap AR1 can be determined by the profile of the patterned mask MA1 (see FIGS. 4A to 4C). In some embodiments, if the lateral width W1 is too large (e.g., greater than 1000 nm), the air gaps AR1 may be too large and the transistor may not work due to large gate-channel separation. On the other hand, if the lateral width W1 is too small, the air gaps AR1 may be too small and may not be able to obtain a desired device performance.

Figure 6B:
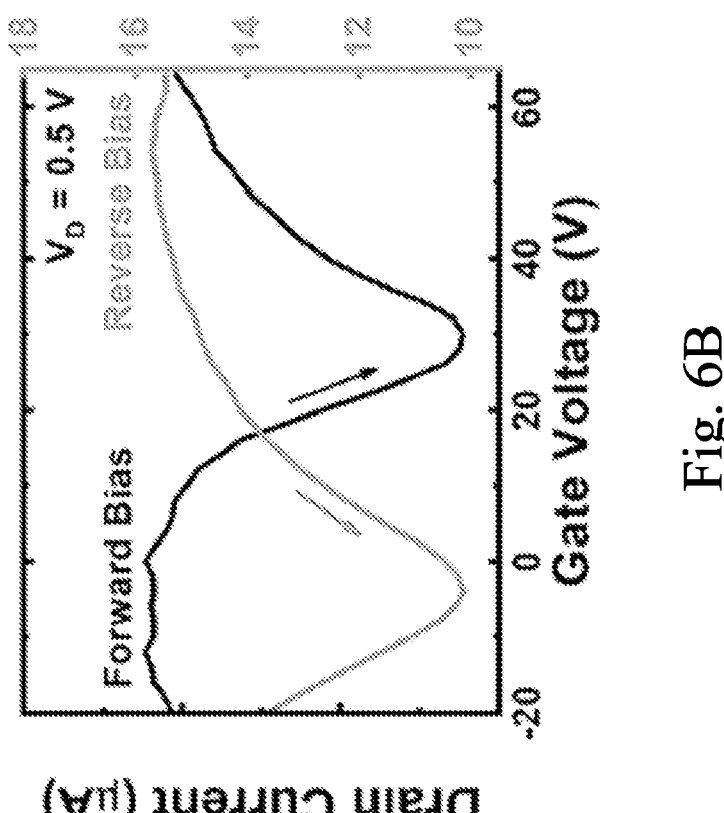
FIG. 6B is an experiment result of a semiconductor device in accordance with some embodiments of the present disclosure.
Figure 6A:
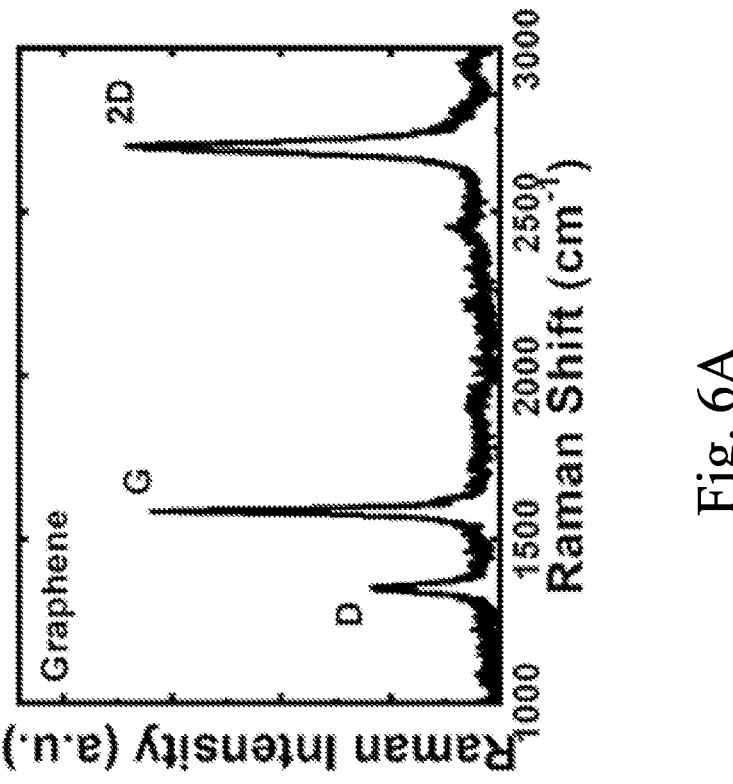
FIG. 6A is an experiment result of a semiconductor device in accordance with some embodiments of the present disclosure.

Reference is made to FIG. 6A. To demonstrate the feasibility of 2-D material on the architecture of in-plane gate transistor, a graphene film grown directly on sapphire substrate is prepared. The Raman spectrum of the sample is shown in FIG. 6A. In FIG. 6A, the ratio of D/G peak is around 0.4, which indicates that a continuous graphene film could be grown directly on sapphire substrate using CVD. Compared with the counterpart where a graphene film is grown on copper foils, the graphene film grown on sapphire substrate requires no transferring processes and can further simplify the device fabrication. Therefore, the growth scheme is suitable for the architecture of in-plane gate transistor.

Reference is made to FIG. 6B. The voltage-current transfer curves of the device (e.g., the transistor shown of FIGS. 5A to 5C) under forward and reverse biases at $V_{DS}=0.5$ V are shown. Standard characteristics of graphene transistor with the Dirac point located at about 30 V gate biases are observed for the device. The derived hole mobility and the derived electron mobility of the device are 90.0 and 77.0 cm²/V·s, respectively. The hole mobility is close to that commonly observed for the directly grown graphene films via the Hall measurement (p-type, 100-200 cm²/V·s). The result supports the architecture of in-plane gate transistor for 2-D material and shows the potential for abandoning gate dielectrics (e.g., using air gap as gate dielectric).

FIGS. 7A to 11C illustrate a semiconductor device in various stages of fabrication in accordance with some embodiments of the present disclosure. It is noted that some elements described in FIGS. 7A to 11C are similar to or the same as those described in FIGS. 1A to 5C, such elements are labeled the same, and relevant details will not be repeated for brevity.

Figure 7A:
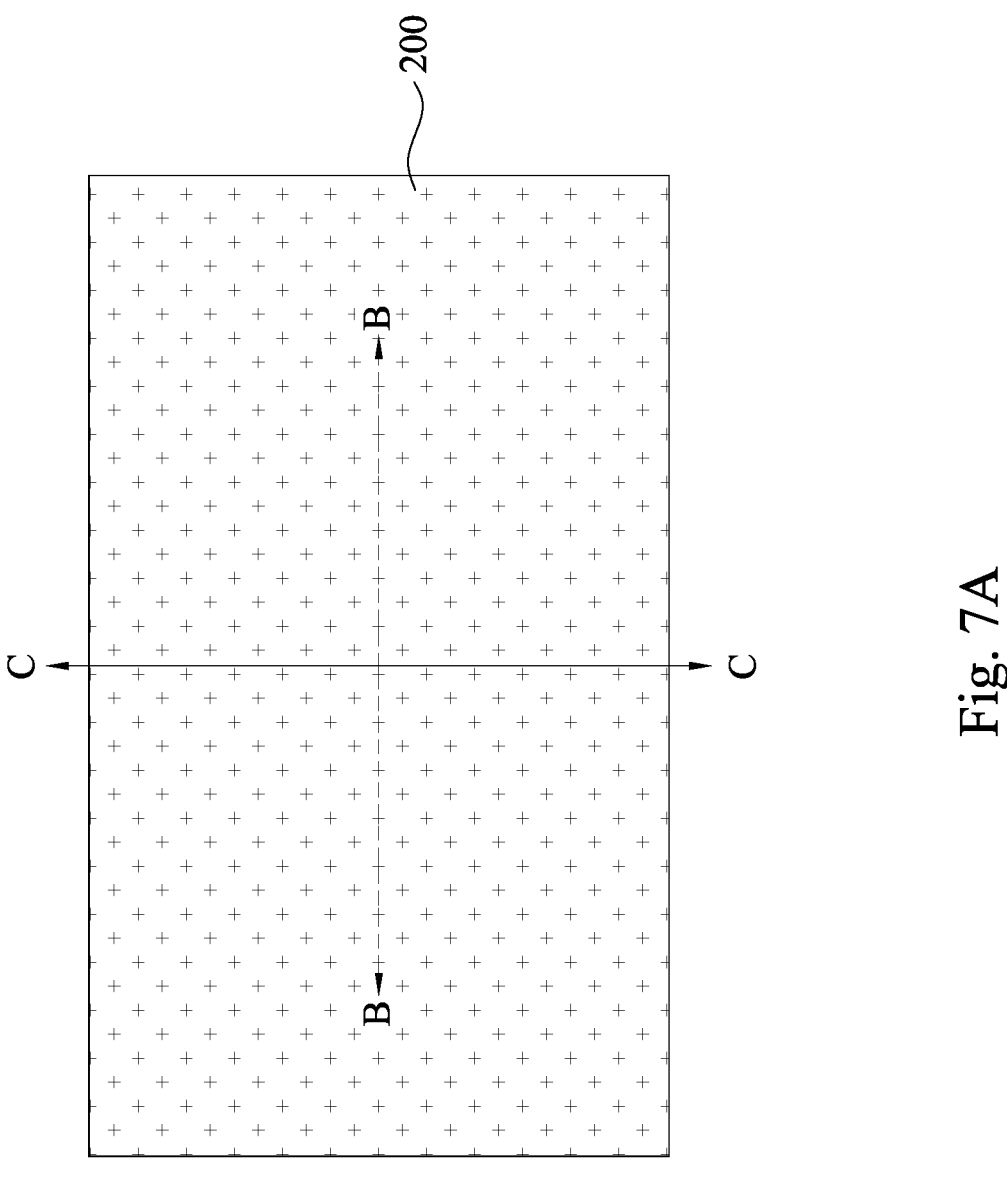
FIGS. 7A to 11C illustrate a semiconductor device in various stages of fabrication in accordance with some embodiments of the present disclosure.
Figure 7A:
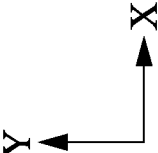
Figure 7B:
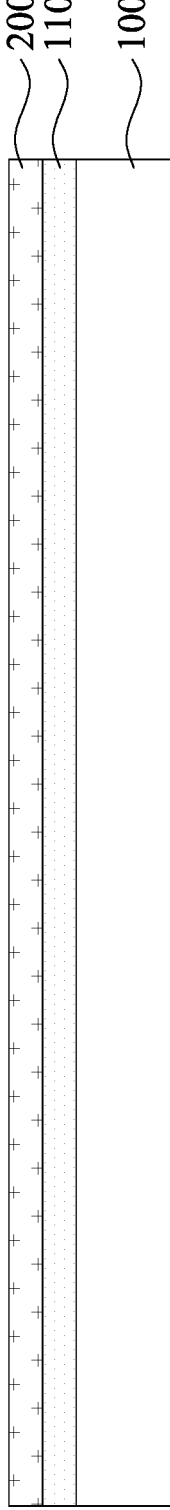
FIG. 7D illustrates a schematic view of a mono-layer of a TMD in accordance with some embodiments of the present disclosure.
Figure 7C:
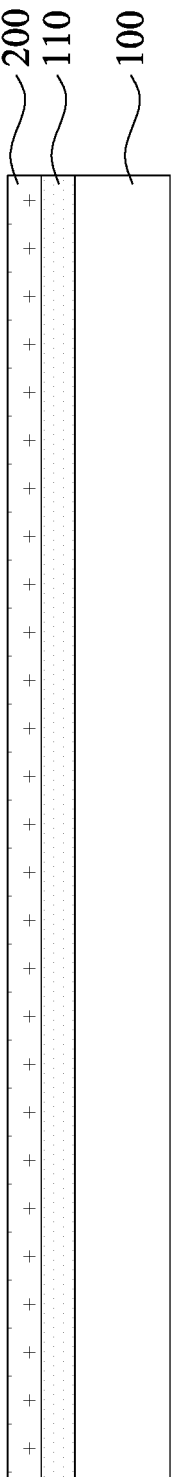

Reference is made to FIGS. 7A to 7C, in which FIG. 7A is a top view of a semiconductor device, FIG. 7B is a cross-sectional view along line B-B of FIG. 7A, and FIG. 7C is a cross-sectional view along line C-C of FIG. 7A. A 2-D material layer 110 is formed over the substrate 100, which has been described in FIGS. 1A to 1C. After the 2-D material layer 110 is formed, a passivation layer 200 is formed over the 2-D material layer 110. In some embodiments, the passivation layer 200 may be vertically separated from the substrate 100 through the 2-D material layer 110.

In some embodiments, the passivation layer 200 may be made of a 2-D material, and thus the passivation layer 200 can also be referred to as a 2-D material passivation layer 200. In some embodiments, the 2-D material passivation layer 200 is made of a different 2-D material than the 2-D material layer 110. For example, the 2-D material passivation layer 200 may be made of transition metal dichalcogenides (TMDs). In some embodiments, the 2-D material passivation layer 200 contains metal element, while the 2-D material layer 110 is free of metal element. In some embodiments, the 2-D material passivation layer 200 is a less conductive 2-D material layer, while the 2-D material layer 110 is a conductive 2-D material layer (e.g., graphene).

Figure 7D:
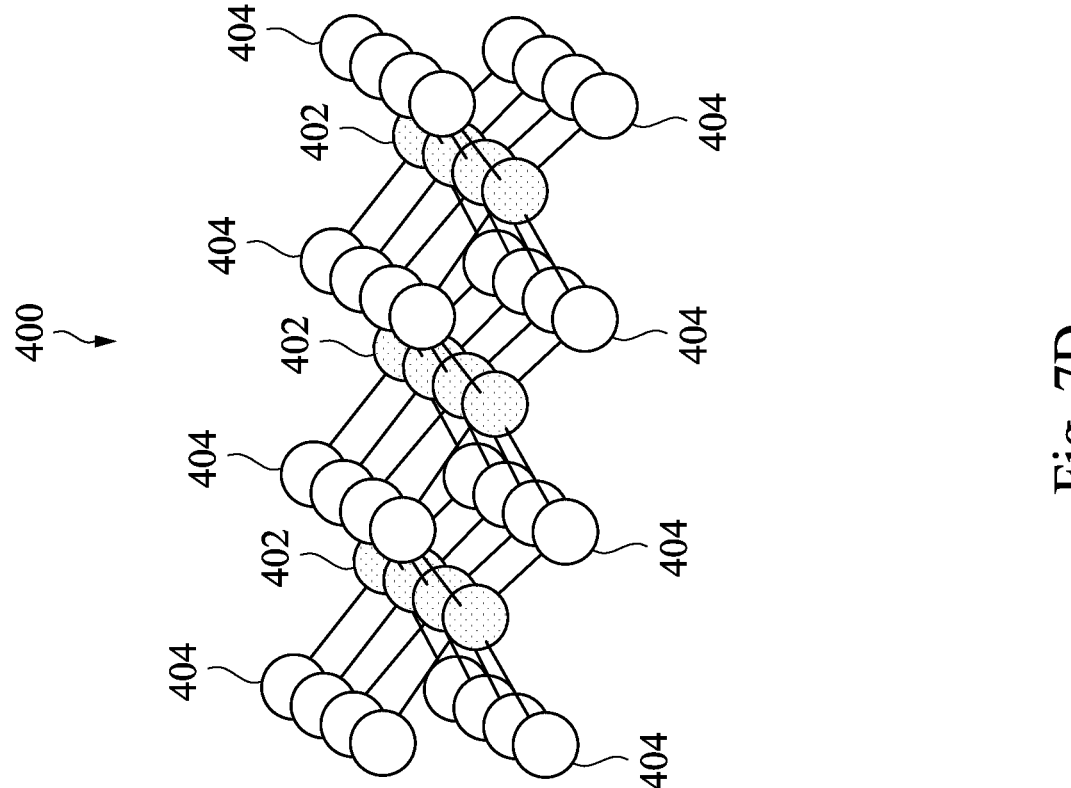

FIG. 7D illustrates a schematic view of a mono-layer 400 of an example TMD in accordance with some example embodiments. In FIG. 7D, the one-molecule thick TMD material layer includes transition metal atoms 402 and chalcogen atoms 404. The transition metal atoms 402 may form a layer in a middle region of the one-molecule thick TMD material layer, and the chalcogen atoms 404 may form a first layer over the layer of transition metal atoms 402, and a second layer underlying the layer of transition metal atoms 402. The transition metal atoms 402 may be W atoms or Mo atoms, while the chalcogen atoms 404 may be S atoms, Se atoms, or Te atoms. Throughout the description, the illustrated cross-bonded layers including one layer of transition metal atoms 402 and two layers of chalcogen atoms 404 in combination are referred to as a mono-layer 400 of TMD.

In some embodiment where the 2-D material passivation layer 200 includes TMD monolayers, the TMD monolayers include molybdenum disulfide ($MoS_2$), molybdenum diselenide ($MoSe_2$), tungsten disulfide ($WS_2$), tungsten diselenide ($WSe_2$), or the like.

In some embodiments where the 2-D material passivation layer 200 is made of $MoS_2$, a $MoO_3$ film may be deposited over a graphene layer (e.g., the 2-D material layer 110) by using thermal evaporation. After the $MoO_3$ is deposited, a sulfurization procedure is performed. The substrate (e.g., the substrate 100) is placed in the center of a furnace for sulfurization. In some other embodiments, other physical deposition techniques such as molecular beam epitaxy (MBE), e-gun evaporation, RF sputtering and pulse laser deposition (PLD) may also be adopted for the depositions of the transition metals. In some embodiments, the 2-D material passivation layer 200 can be deposited with a temperature under 400° C.

In some other embodiments, the passivation layer 200 may be made of a dielectric material. For example, the dielectric material may be an oxide, such as aluminum oxide ($Al_2O_3$), silicon oxide ($SiO_2$), or the like.

Figure 8A:
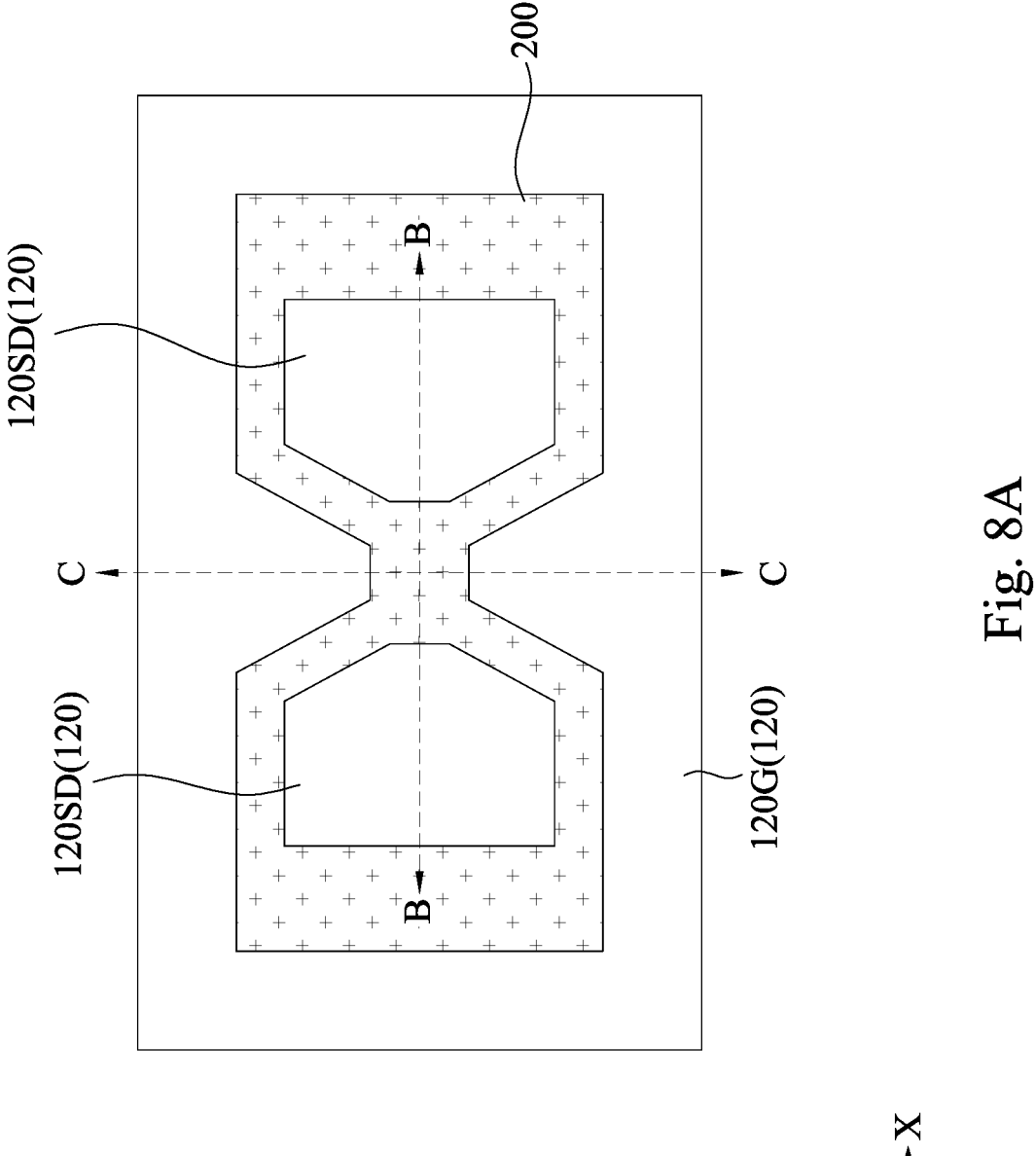
Figures 8B, 8C:
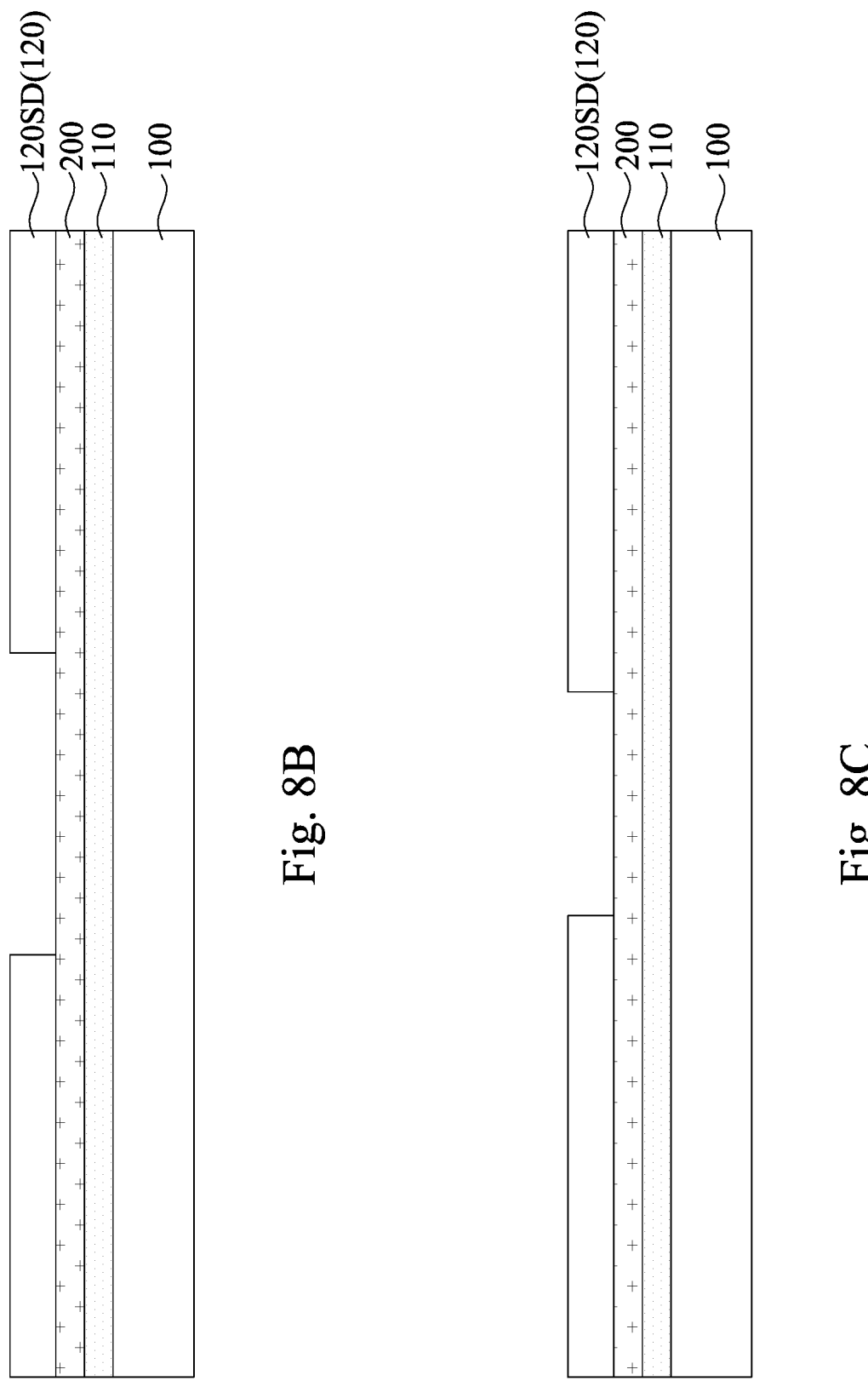

Reference is made to FIGS. 8A to 8C, in which FIG. 8A is a top view of a semiconductor device, FIG. 8B is a cross-sectional view along line B-B of FIG. 8A, and FIG. 8C is a cross-sectional view along line C-C of FIG. 8A. A contact electrode layer 120 is formed over the passivation layer 200. In some embodiments, top surface of the passivation layer 200 may be exposed from the gate contact electrode 120G and the source/drain contact electrodes 120SD of the contact electrode layer 120.

Figure 9A:
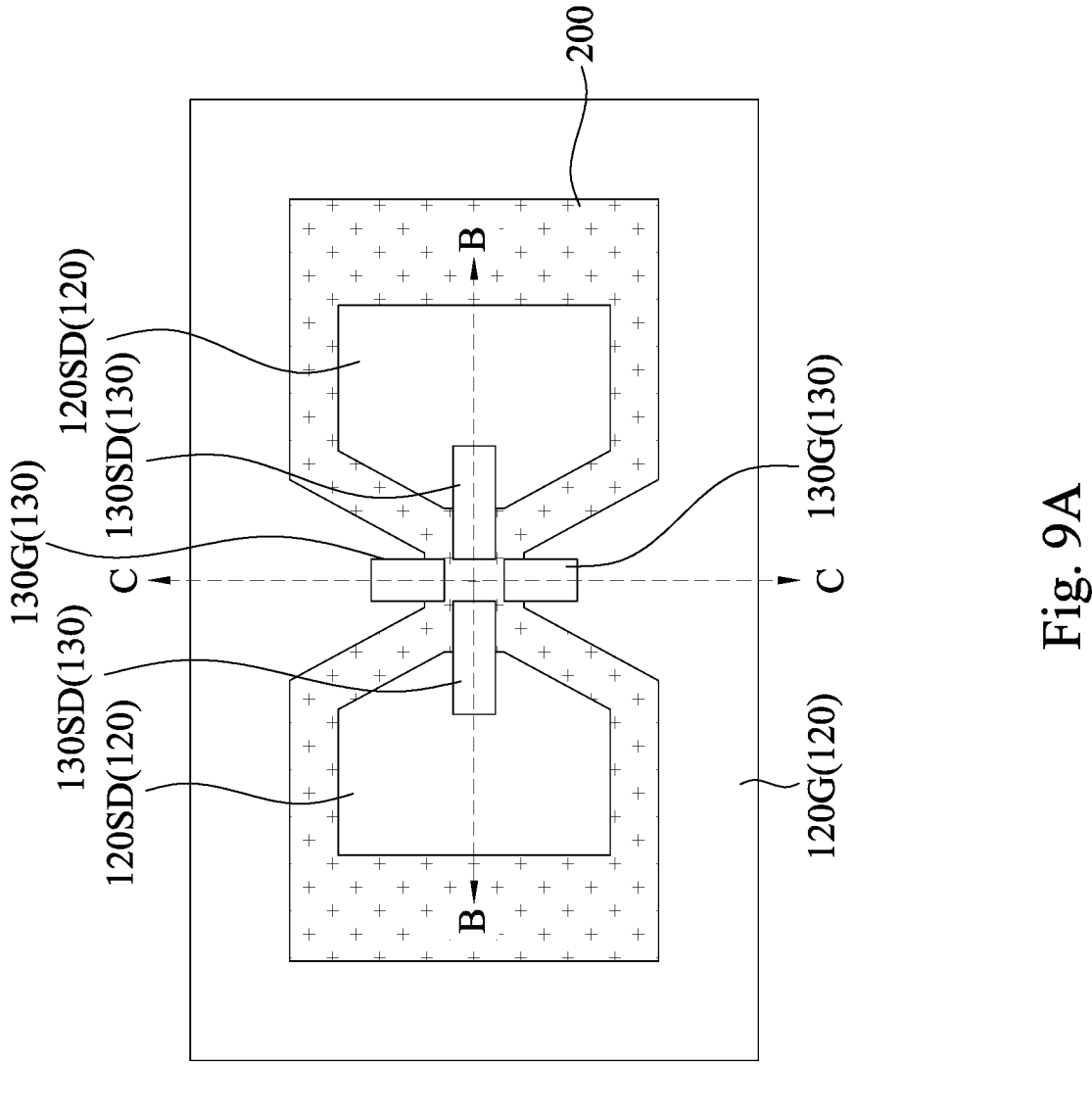
Figures 9B, 9C:
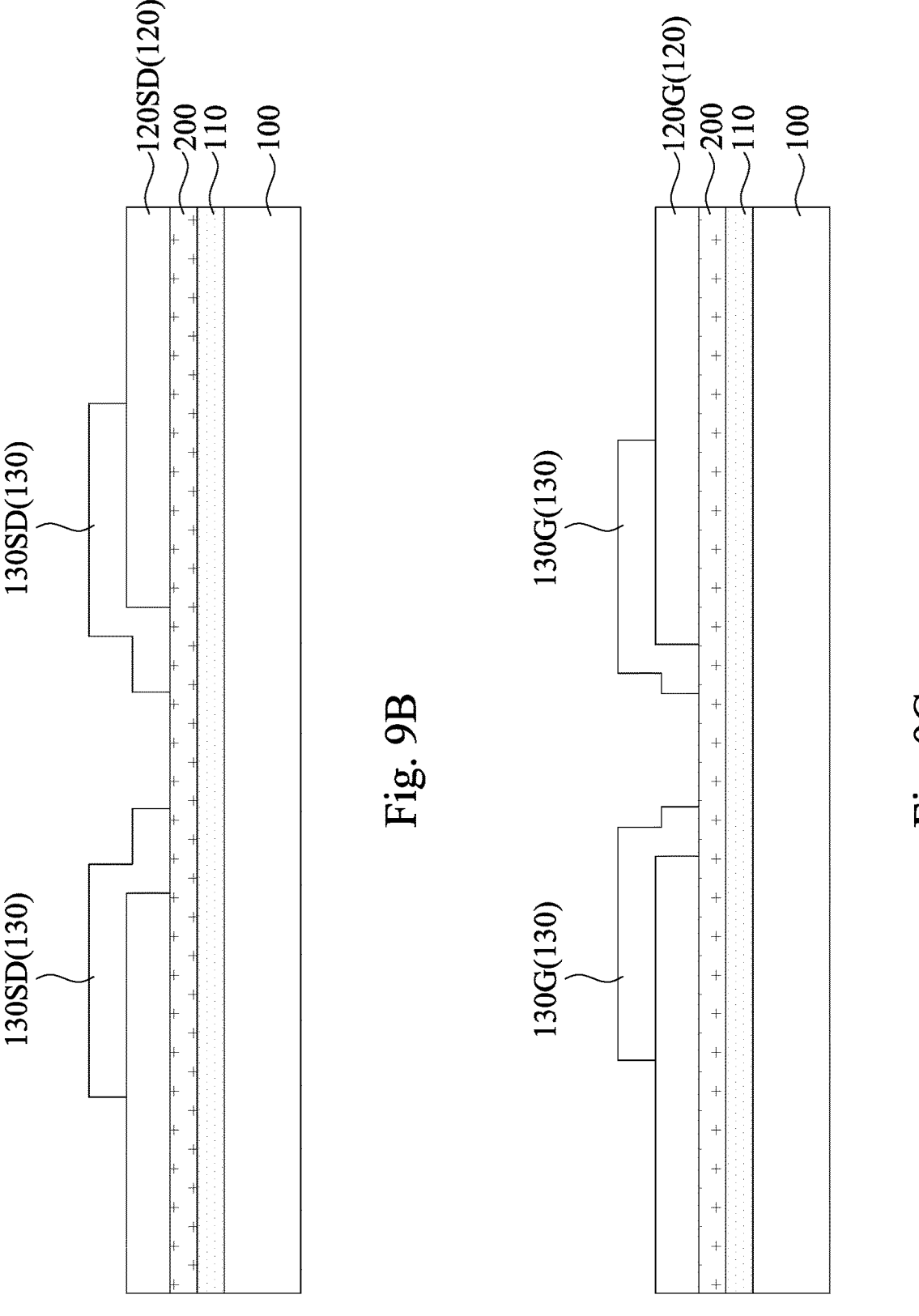

Reference is made to FIGS. 9A to 9C, in which FIG. 9A is a top view of a semiconductor device, FIG. 9B is a cross-sectional view along line B-B of FIG. 9A, and FIG. 9C is a cross-sectional view along line C-C of FIG. 9A. A metal layer 130 is deposited over the substrate 100 and covering portions of the passivation layer 200 and the contact electrode layer 120. In some embodiments, the metal layer 130 may include gate metals 130G and source/drain metals 130SD.

As shown in FIG. 9B, with respect to the source/drain metals 130SD, each of the source/drain metals 130SD may extend from top surface of a corresponding source/drain contact electrode 120SD, through sidewall of the corresponding source/drain contact electrode 120SD, to top surface of the passivation layer 200.

As shown in FIG. 9C, with respect to the gate metals 130G, each of the gate metals 130G may extend from top surface of a corresponding extension portion 120G-2 of the gate contact electrode 120G, through sidewall of the corresponding gate contact electrode 120G, to top surface of the passivation layer 200.

Figure 10A:
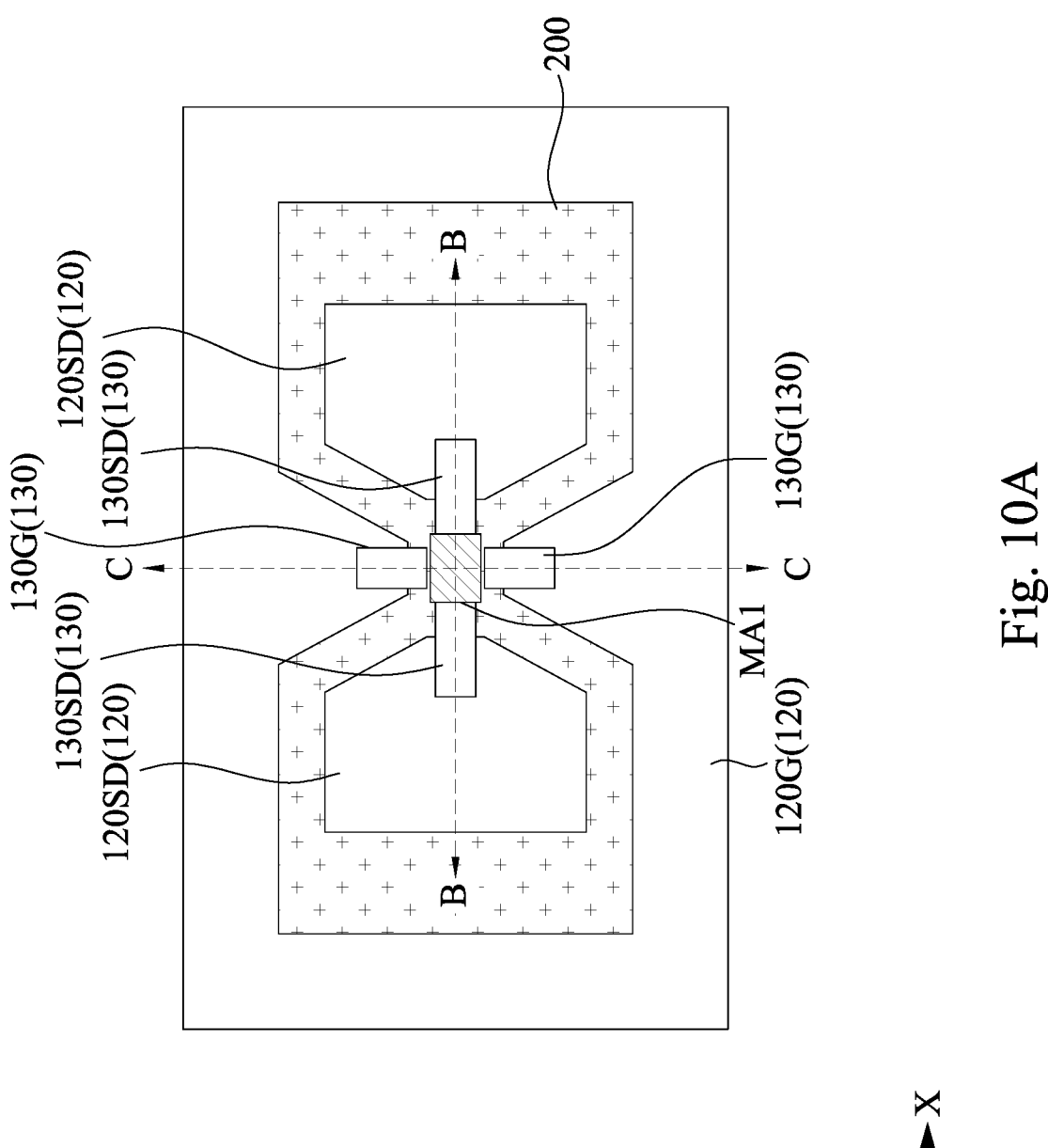
Figures 10B, 10C:
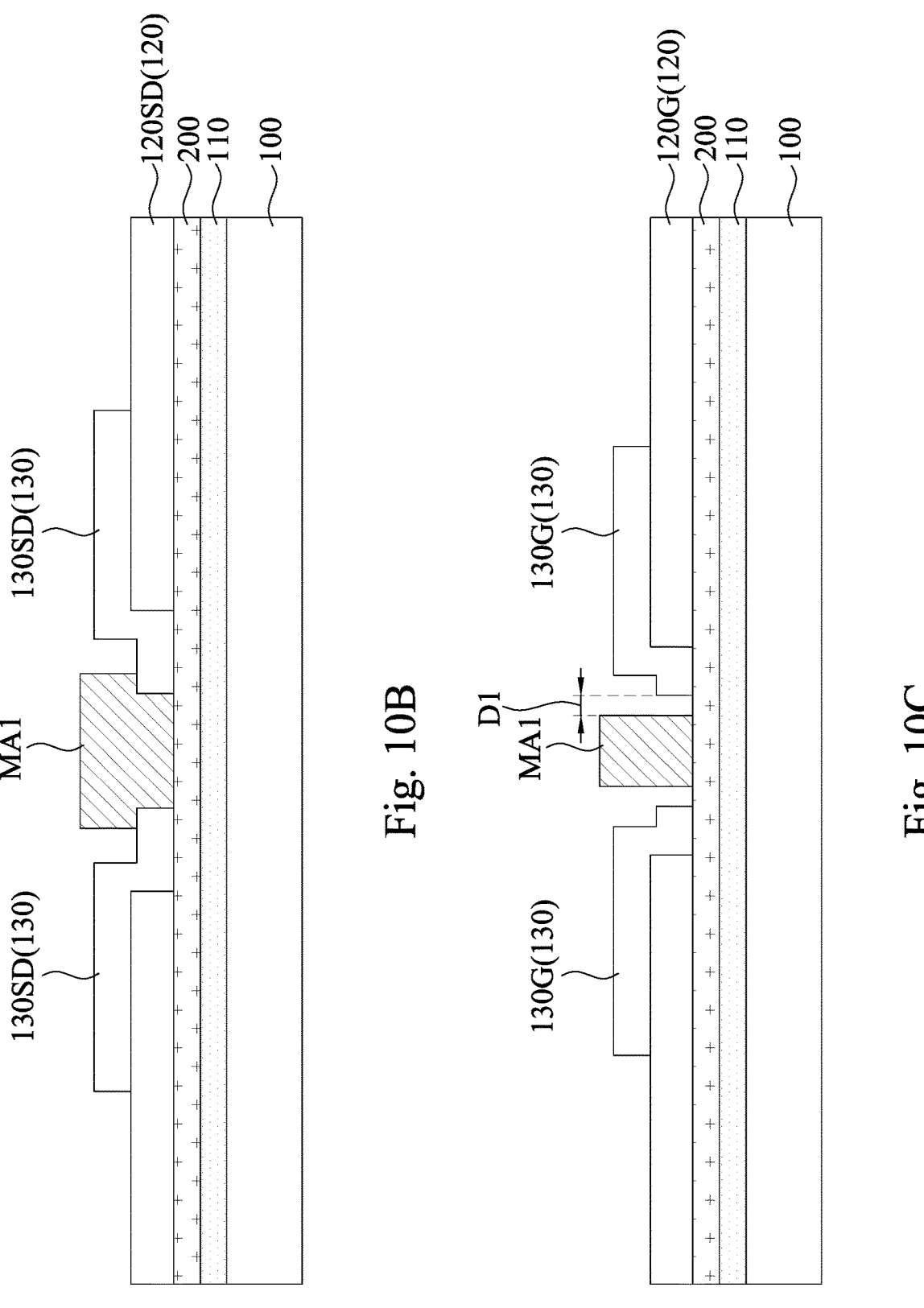

Reference is made to FIGS. 10A to 10C, in which FIG. 10A is a top view of a semiconductor device, FIG. 10B is a cross-sectional view along line B-B of FIG. 10A, and FIG. 10C is a cross-sectional view along line C-C of FIG. 10A. A patterned mask MA1 is formed over the substrate 100 and covering portions of the metal layer 130 and the passivation layer 200. As shown in the cross-section views of FIGS. 10B and 10C, the patterned mask MA1 is in contact with top surface of the passivation layer 200. In FIG. 10C, the lateral distance D1 (along the Y-direction) between the patterned mask MA1 and each gate metal 130G is in a range from about 1 nm to 300 nm.

Figure 11A:
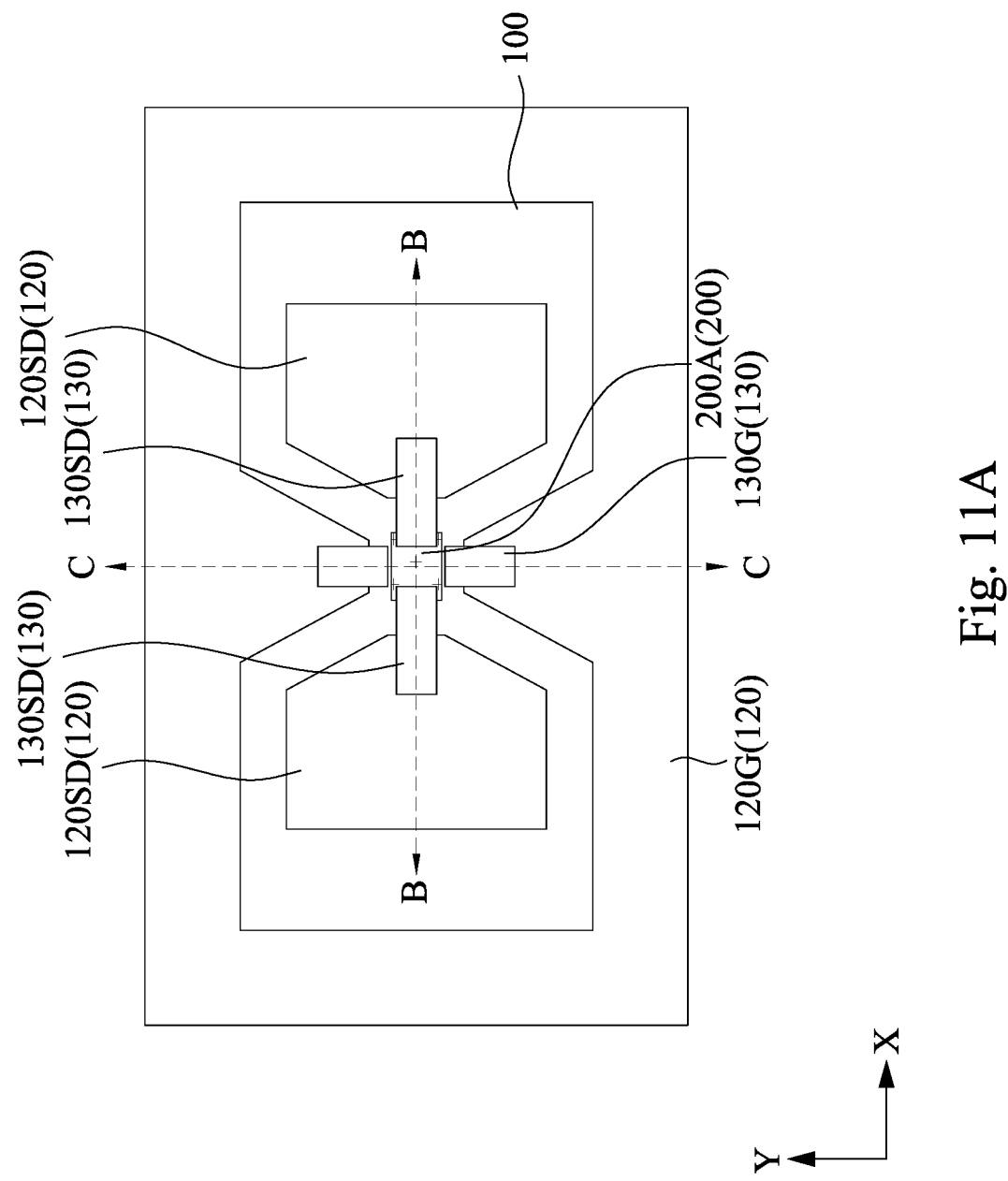
Figures 11B, 11C:
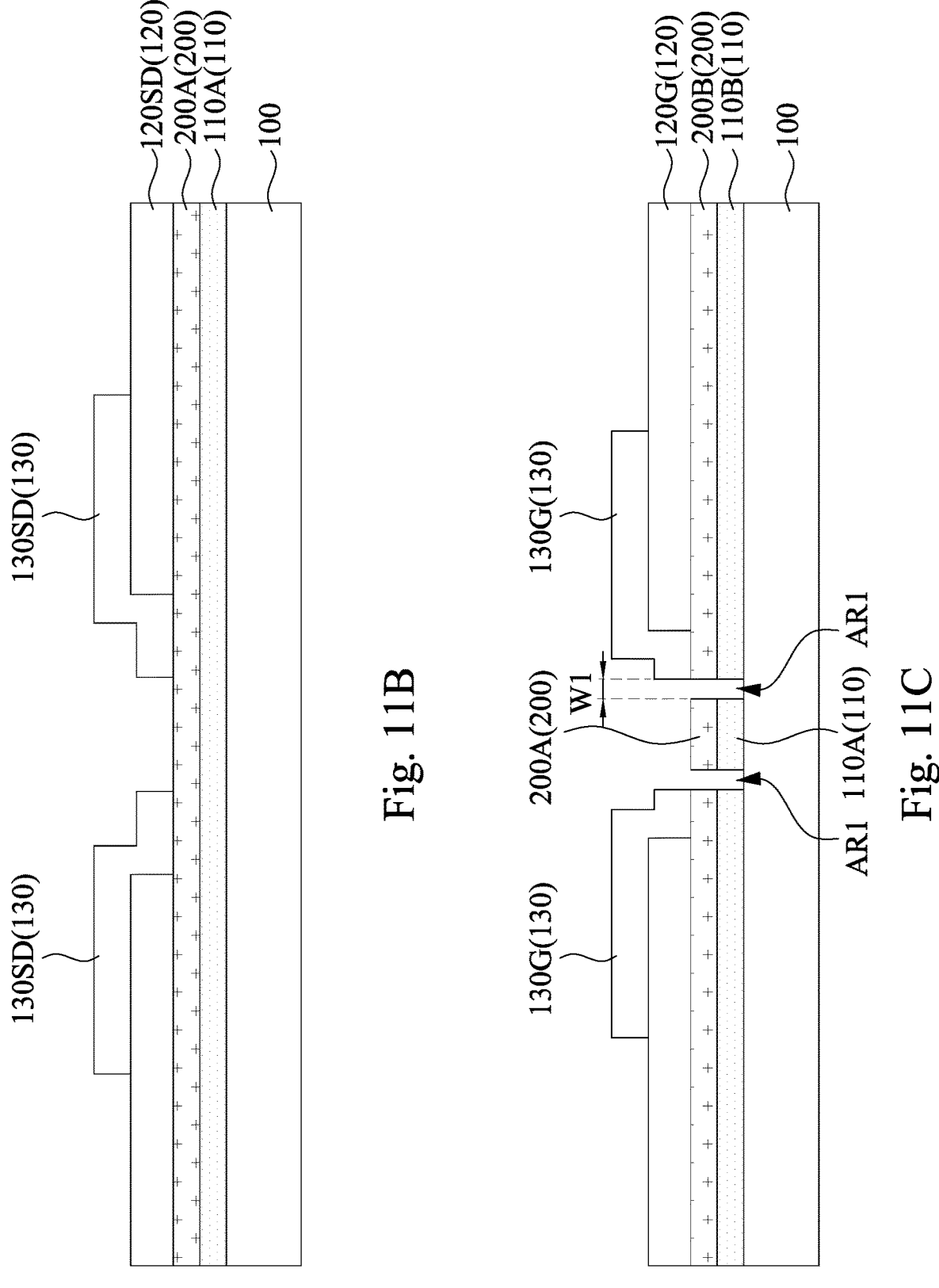

Reference is made to FIGS. 11A to 11C, in which FIG. 11A is a top view of a semiconductor device, FIG. 11B is a cross-sectional view along line B-B of FIG. 11A, and FIG. 11C is a cross-sectional view along line C-C of FIG. 11A. An etching process is performed to remove portions of the 2-D material layer 110 and the passivation layer 200 that are exposed by the patterned mask MA1, the metal layer 130, and the contact electrode layer 120. After the etching process is completed, the patterned mask MA1 is removed. In some embodiments, air gaps AR1 are formed. The lateral width W1 of the air gap AR1 (along the Y-direction) between the channel region of the 2-D material layer 110A and the corresponding gate metals 130G is in a range from about 1 nm to 300 nm.

Similar to the etched 2-D material layer 110 as described in FIGS. 5A to 5C, the etched passivation layer 200 may include a remaining portion 200A and a remaining portion 200B, in which the remaining portion 200A is spatially separated from the remaining portion 200B. The remaining portions 200A and 200B of the passivation layer 200 can also be referred to as passivation layers 200A and 200B. In some embodiments, the passivation layer 200A is covered at least in part by the source/drain metals 130SD and the source/drain contact electrodes 120SD, and a portion of the passivation layer 200A is exposed by the source/drain metals 130SD and the source/drain contact electrodes 120SD. On the other hand, the passivation layer 200B is under the gate contact electrode 120G and the gate metals 130G. In some embodiments, an entirety of the passivation layer 200B is under the gate contact electrode 120G and the gate metals 130G. In some embodiments, each air gap AR1 is laterally between the passivation layer 200A and a corresponding passivation layer 200B.

In some embodiments, the top surface of the 2-D material layer 110A is covered by the passivation layer 200A, while the sidewalls of the 2-D material layer 110A may be exposed through the air gaps AR1 (see FIG. 11C). Similarly, the top surface of the 2-D material layer 110B is covered by the passivation layer 200B, while the sidewalls of the 2-D material layer 110B may be exposed through the air gaps AR1 (see FIG. 11C). That is, the 2-D material layer 110A is vertically separated from the source/drain metals 130SD and the source/drain metals 130SD through the passivation layer 200A, and the 2-D material layer 110B is vertically separated from the gate contact electrode 120G and the gate metals 130G through the passivation layer 200B. In some embodiments, because the 2-D material layer 110 and the passivation layer 200 are etched using a same mask, the 2-D material layers 110A and 110B may include substantially the same patterns as the passivation layers 200A and 200B, respectively. For example, in FIG. 11C, sidewalls of the 2-D material layer 110A may be vertically aligned with sidewalls of the passivation layer 200A, and sidewalls of the 2-D material layers 110B may be vertically aligned with sidewalls of the passivation layers 200B, respectively.

In some embodiments where the passivation layer 200 is made of 2-D material, the passivation layer 200 may include few mono-layers. Accordingly, the passivation layer 200 may be thin enough and would not affect the electrical connection between the 2-D material layer 110 and the overlying layer, such as the contact electrode layer and the metal layer.

In the embodiments of the present disclosure, when a graphene channel layer is exposed (e.g., the 2-D material layer 110 of FIGS. 5A to 5C), water and gas molecules may affect the property of the graphene channel layer, which will also affect the device performance. For example, for an in-plane gate transistor where graphene channel layer is exposed, the Dirac point shifts to −4.0 V under reverse gate bias (see FIG. 6B), indicating that the water and gas molecules may influence the device performance under the ambient condition. An approach to prevent the attachment of water or gas molecules to the graphene channel layer is to passivate the graphene cannel layer. Since dielectric materials for gates may bring additional influence to the graphene channel and do not conform to the concept behind in-plane gate transistors, one promising candidate for passivation layer can be other 2-D material layer (e.g., the 2-D material passivation layer 200). The van der Waal forces instead of chemical bonds between the 2-D material channel layer and the 2-D material passivation layer is the main mechanism why the 2-D material passivation layer is a beneficial choice than other materials.

Figure 12B:
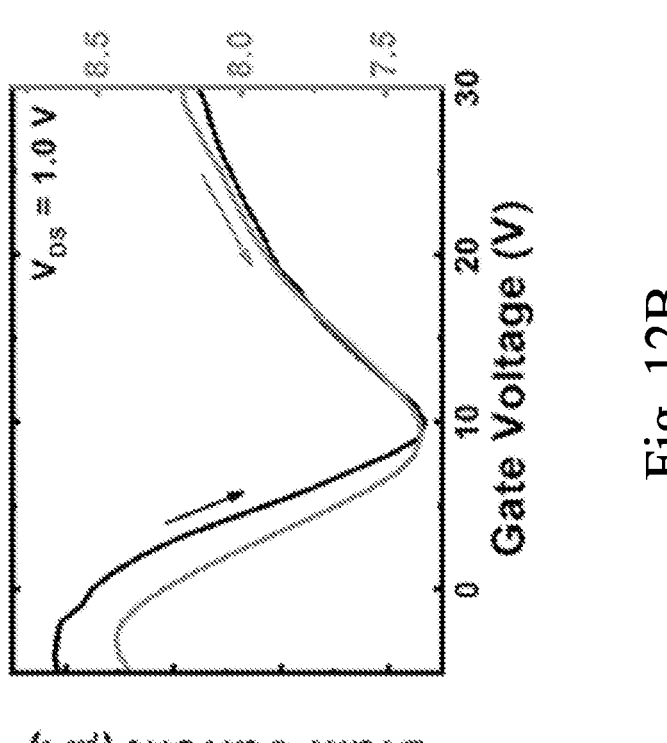
FIG. 12B is an experiment result of a semiconductor device in accordance with some embodiments of the present disclosure.
Figure 12A:
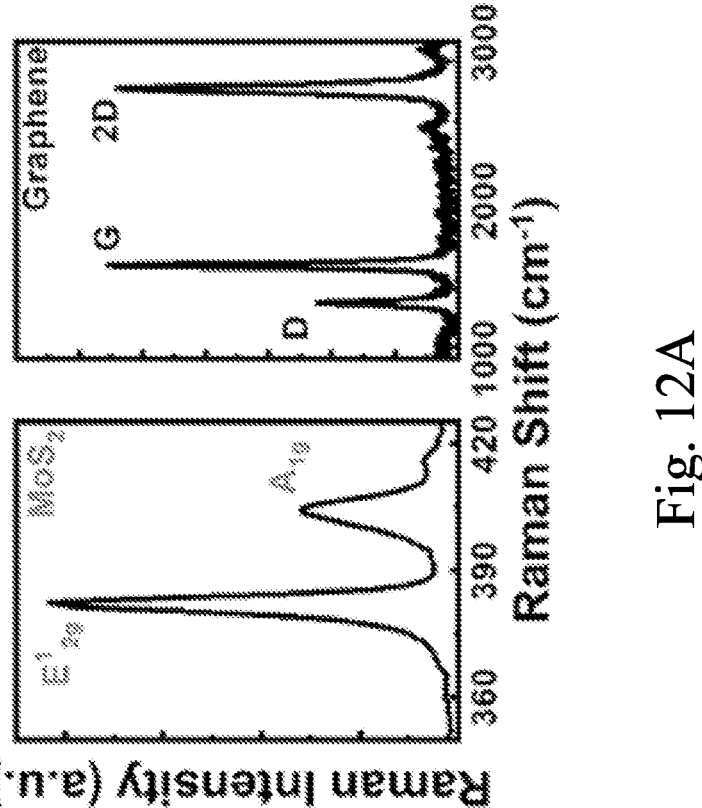
FIG. 12A is an experiment result of a semiconductor device in accordance with some embodiments of the present disclosure.

Reference is made to FIG. 12A. The Raman spectra of the $MoS_2$/graphene hetero-structure corresponding to the characteristic peaks of graphene and $MoS_2$ are shown, respectively The observation of both the graphene and $MoS_2$ Raman peaks indicates that the $MoS_2$/graphene hetero-structure is formed after the sequential growth of graphene and $MoS_2$. The difference delta k between the two Raman peaks of $MoS_2$ is 21.3 cm$^{-1}$, indicating the presence of bi-layer $MoS_2$ after the sulfurization procedure. On the other hand, the similar D/G peak ratios of graphene before and after the $MoS_2$ growth (around 0.4) suggest that by using the thermal evaporator, a limited amount of damage was introduced to the graphene film during the deposition of $MoO_3$.

Reference is made to FIG. 12B. The transfer curves of the device under forward and reverse biases at $V_{DS}=1.0$ V are shown. Similar to the graphene in-plane gate transistor, the device behaves as a typical graphene transistor. The Dirac point at a positive $V_{GS}=10.0$ V indicates a p-type graphene channel under forward biases. The weak hysteresis on the transfer curves suggests that the $MoS_2$ layer can effectively protect the channel from contaminants in environments. The derived hole mobility and the derived electron mobility of the device are 61.0 and 31.0 cm²/V·s, respectively. Compared with the hole mobility 100-200 cm²/V·s of the graphene film on sapphire from Hall measurements, the field-effect mobility is lower. The derived field-effect mobility values are also lower than the standalone graphene in-plane gate transistors discussed above.

FIGS. 13A to 20C illustrate a semiconductor device in various stages of fabrication in accordance with some embodiments of the present disclosure. It is noted that some elements described in FIGS. 13A to 20C are similar to or the same as those described in FIGS. 1A to 5C and in FIGS. 7A to 11C, such elements are labeled the same, and relevant details will not be repeated for brevity.

Figure 13A:
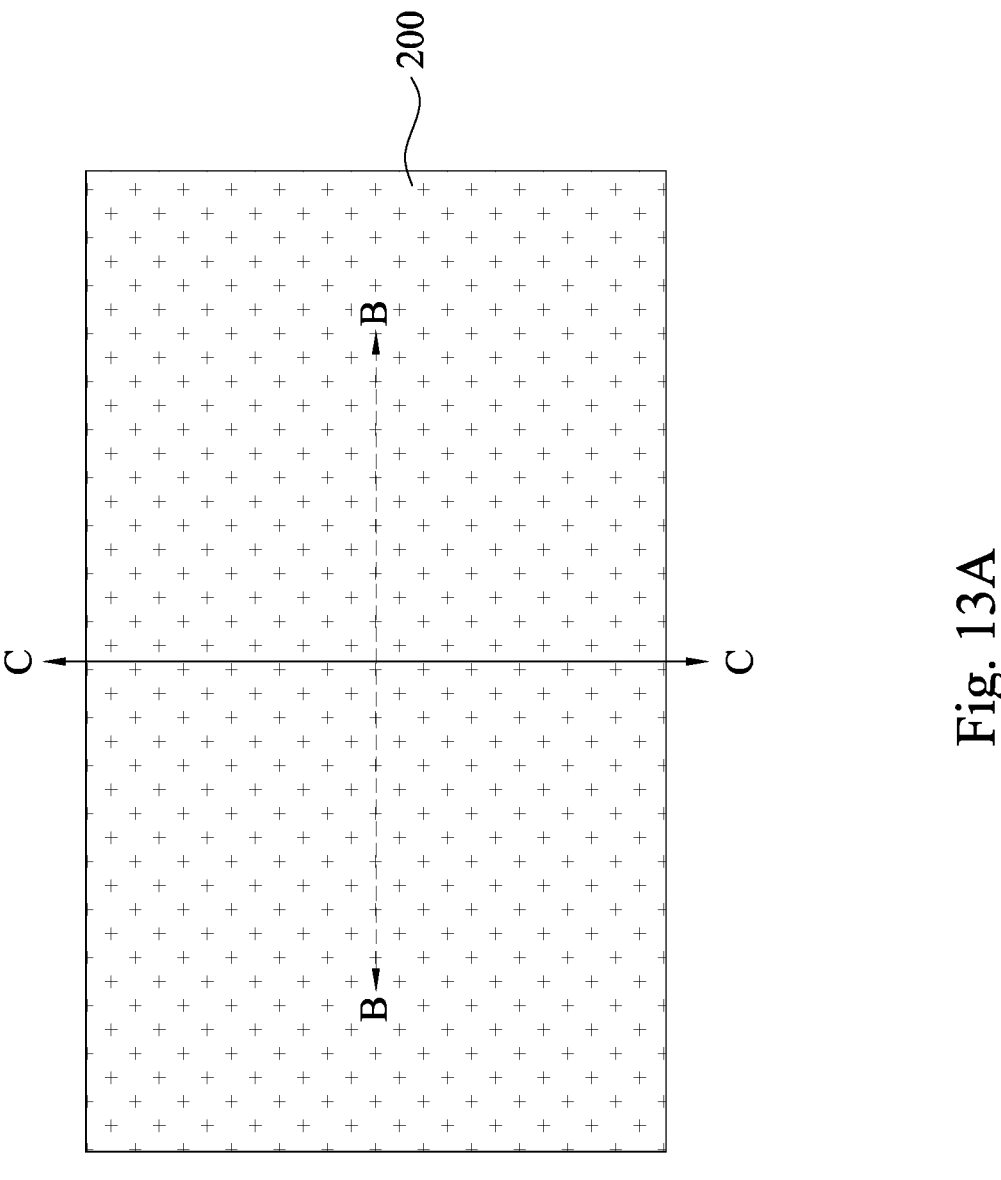
FIGS. 13A to 20C illustrate a semiconductor device in various stages of fabrication in accordance with some embodiments of the present disclosure.
Figure 13A:
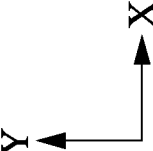
Figure 13B:
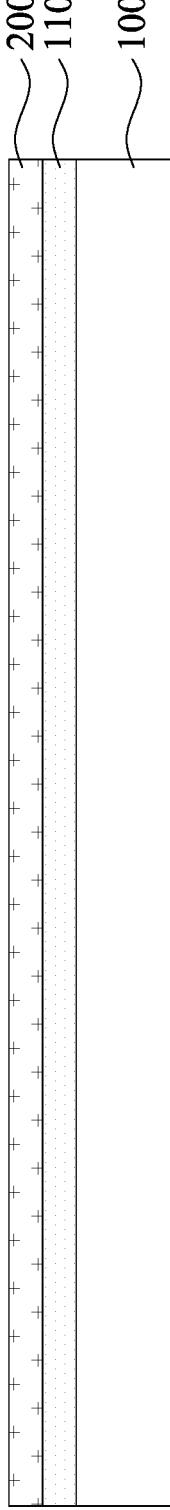
Figure 13C:
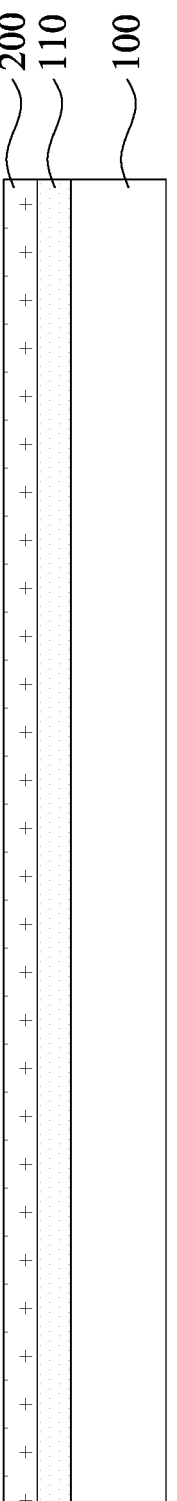

Reference is made to FIGS. 13A to 13C, in which FIG. 13A is a top view of a semiconductor device, FIG. 13B is a cross-sectional view along line B-B of FIG. 13A, and FIG. 13C is a cross-sectional view along line C-C of FIG. 13A. A 2-D material layer 110 is formed over the substrate 100. After the 2-D material layer 110 is formed, a passivation layer 200 is formed over the 2-D material layer 110.

Figure 14A:
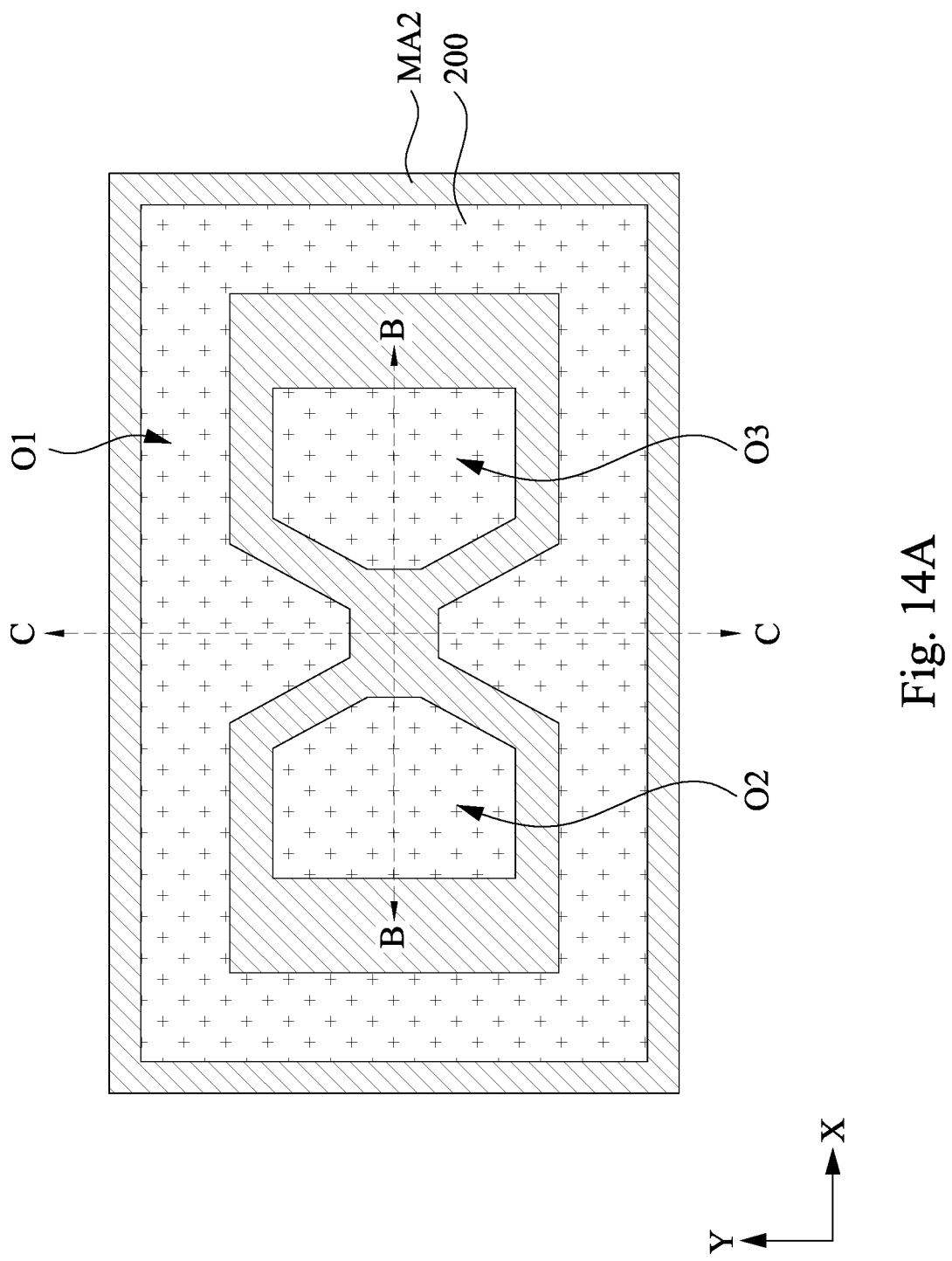
Figures 14B, 14C:
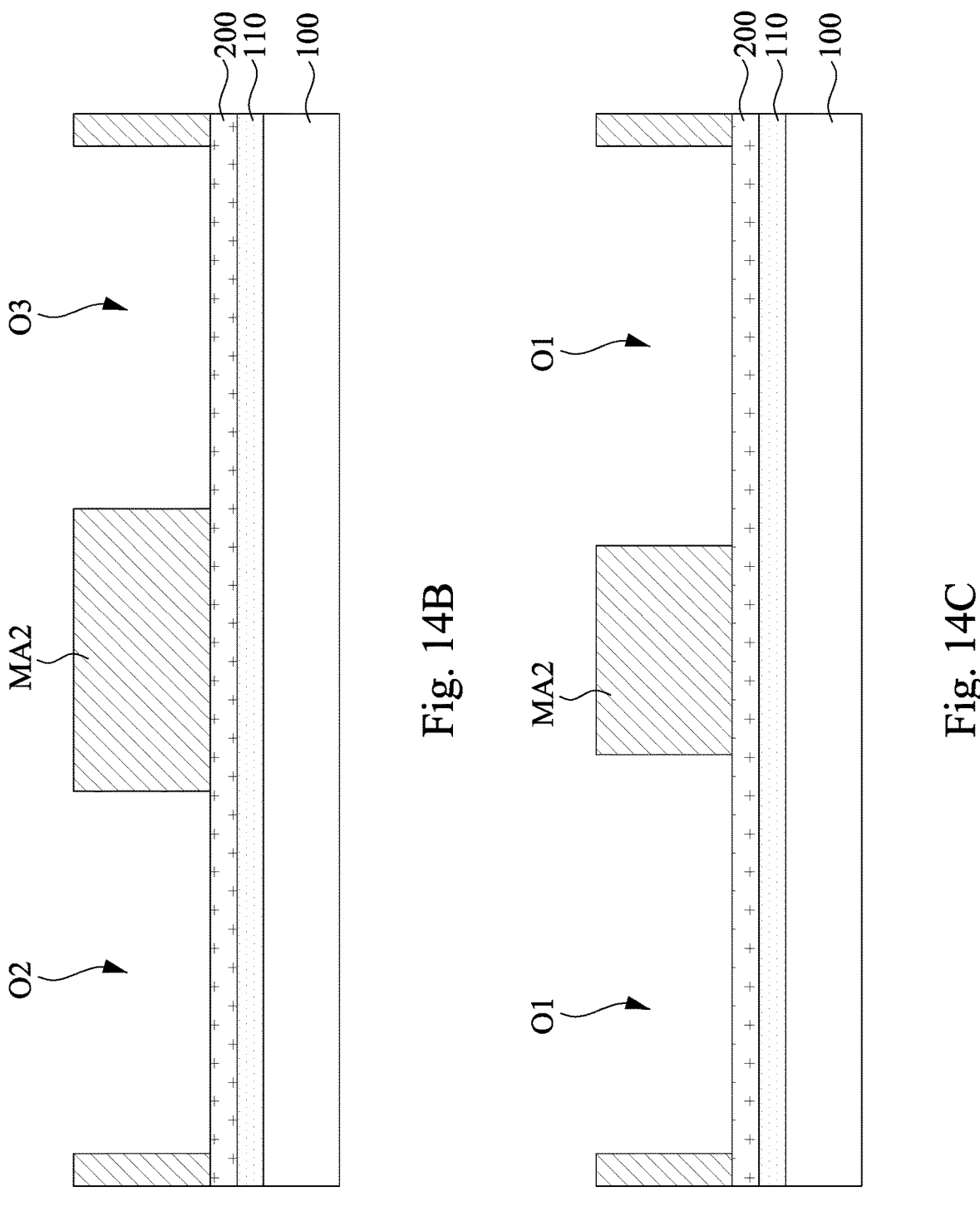

Reference is made to FIGS. 14A to 14C, in which FIG. 14A is a top view of a semiconductor device, FIG. 14B is a cross-sectional view along line B-B of FIG. 14A, and FIG. 14C is a cross-sectional view along line C-C of FIG. 14A. A patterned mask MA2 is formed over the substrate 100 and covering the passivation layer 200. The pattern mask MA2 may include openings O1, O2, and O3 that expose top surface of the passivation layer 200.

In some embodiments, the openings O1, O2, and O3 may define the positions and profiles of the gate contact electrode 120G (see FIGS. 16A to 17C) and the source/drain contact electrodes 120SD (see FIGS. 16A to 17C), respectively. For example, the opening O1 may enclose the openings O2 and O3. Moreover, similar to those described with respect to the contact electrode layer 120 of FIG. 2A, the opening O1 may also include a rectangular ring-shape portion and two extension portions connected to an inner sidewall of the ring-shape portion.

In some embodiments, the patterned mask MA2 may be a photoresist layer. In some embodiments, the photoresist layer may be formed by spinning, spray coating, or other applicable techniques. The photoresist layer may include a light sensitive material such that properties, such as solubility, of the photoresist layer are affected by light.

Figure 15A:
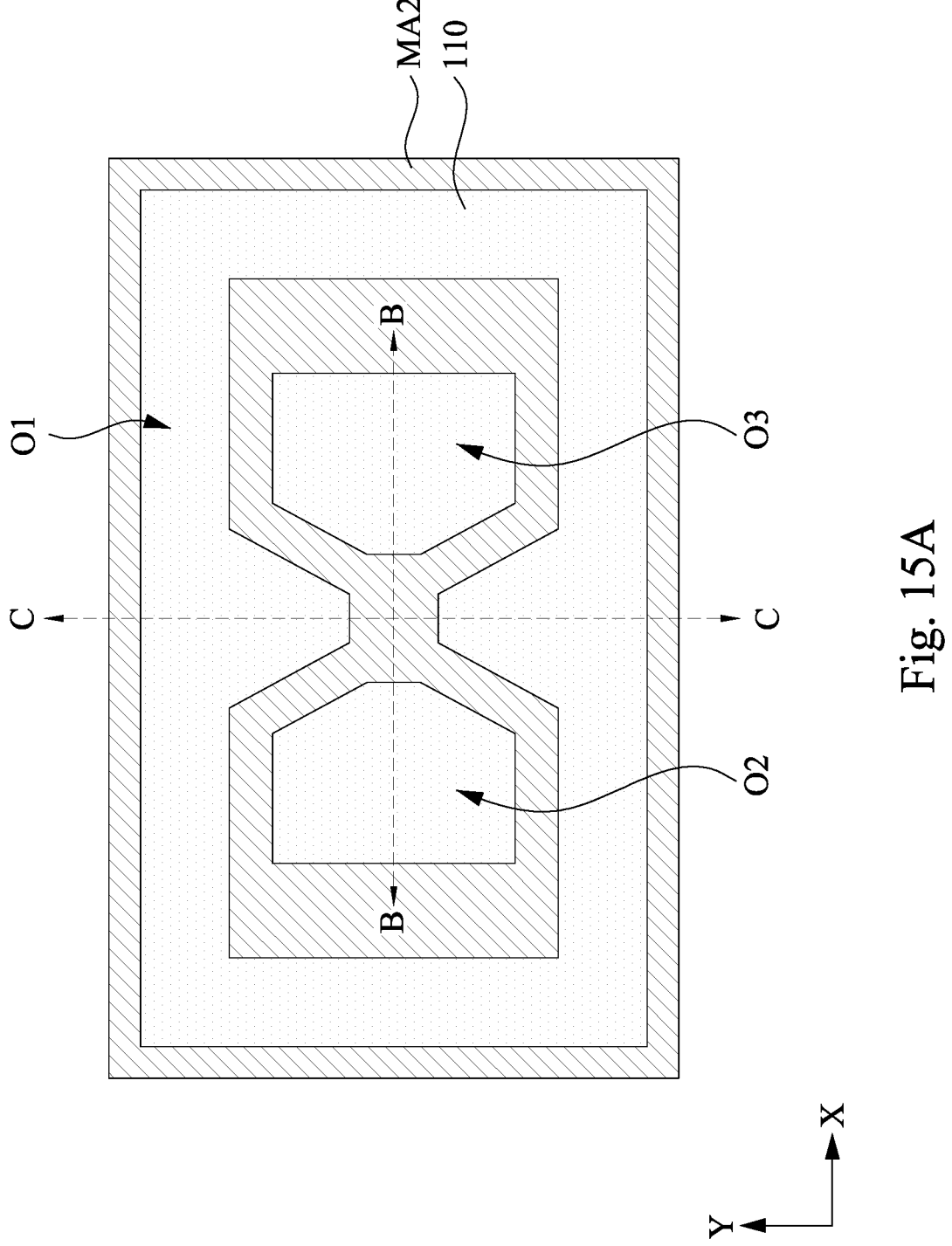
Figures 15B, 15C:
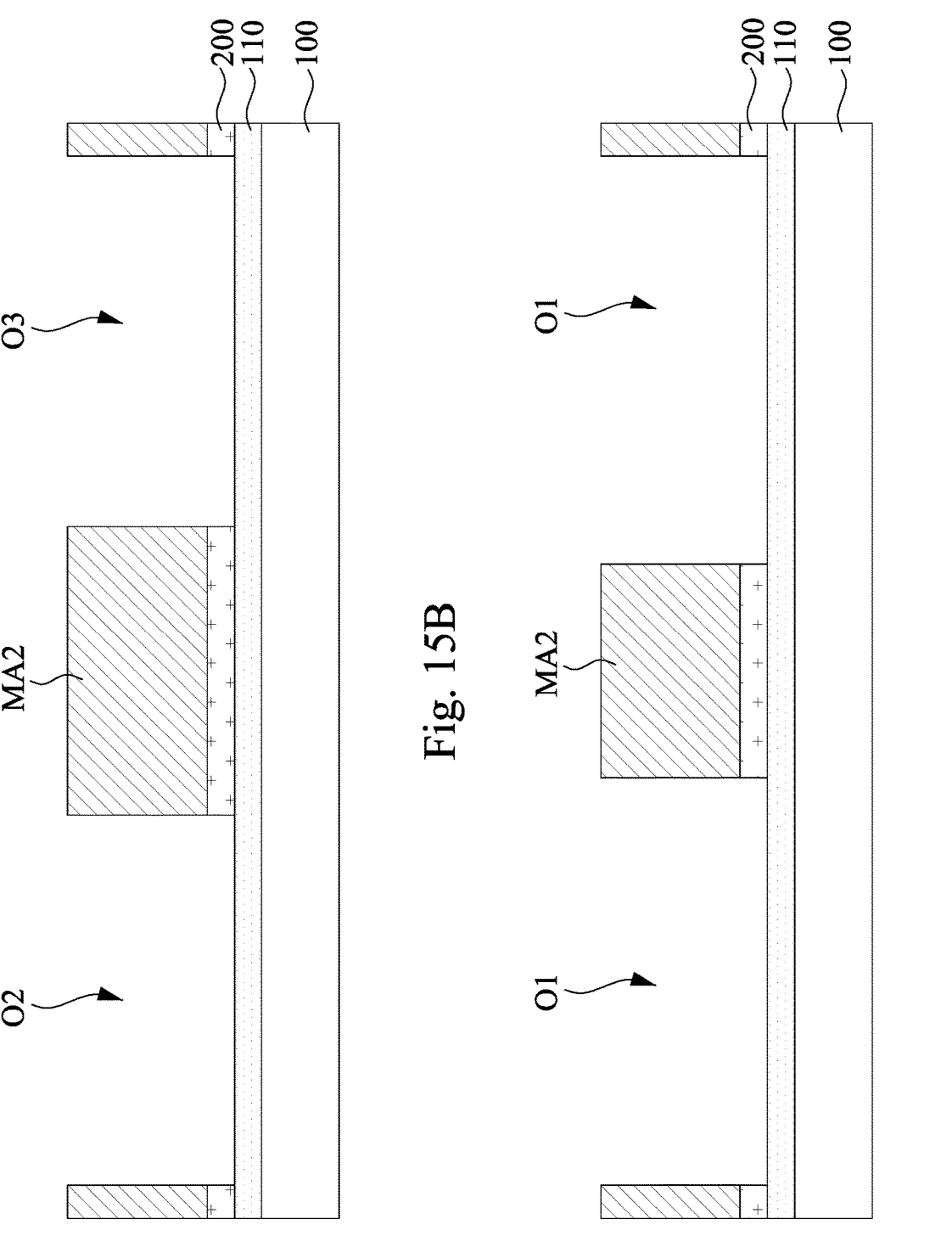

Reference is made to FIGS. 15A to 15C, in which FIG. 15A is a top view of a semiconductor device, FIG. 15B is a cross-sectional view along line B-B of FIG. 15A, and FIG. 15C is a cross-sectional view along line C-C of FIG. 15A. An etching process is performed to remove portions of the passivation layer 200 exposed by the openings O1, O2, and O3. As a result, portions of the underlying 2-D material layer 110 are exposed after the etching process is completed.

In some embodiments, the etching process may include an atomic layer etching (ALE) process. In some embodiments where the passivation layer 200 is made of $MoS_2$, the ALE process is a layered removal mechanism of $MoS_2$ using low-power oxygen plasma. Each ALE cycle includes a low-power oxygen plasma treatment, a dipping procedure, and a re-sulfurization procedure. During the low-power oxygen plasma treatment, the topmost $MoS_2$ mono-layer is oxidized. This will result in a weaker adhesion of Mo oxides with underlying $MoS_2$ surfaces, which may lead to detachment of the topmost oxidized $MoS_2$ layer from the underlying $MoS_2$ films. Afterward, the dipping procedure is performed to remove the topmost oxidized $MoS_2$ layer. Since $MoS_2$ is insoluble and Mo oxides are soluble in water, the dipping procedure of the sample in de-ionized water will help with the complete detachment of the topmost oxidized $MoS_2$ layer. In some embodiments, each ALE cycle may remove one mono-layer of the passivation layer 200. For example, if the passivation layer 200 includes 2 mono-layer of $MoS_2$, the ALE cycle may be performed 2 times to remove the exposed passivation layer 200, so as to expose the underlying 2-D material layer 110. In some embodiments, if the passivation layer 200 has n mono-layers of 2-D material (e.g., $MoS_2$), the ALE cycles of the etching process may be performed n times.

Figure 16A:
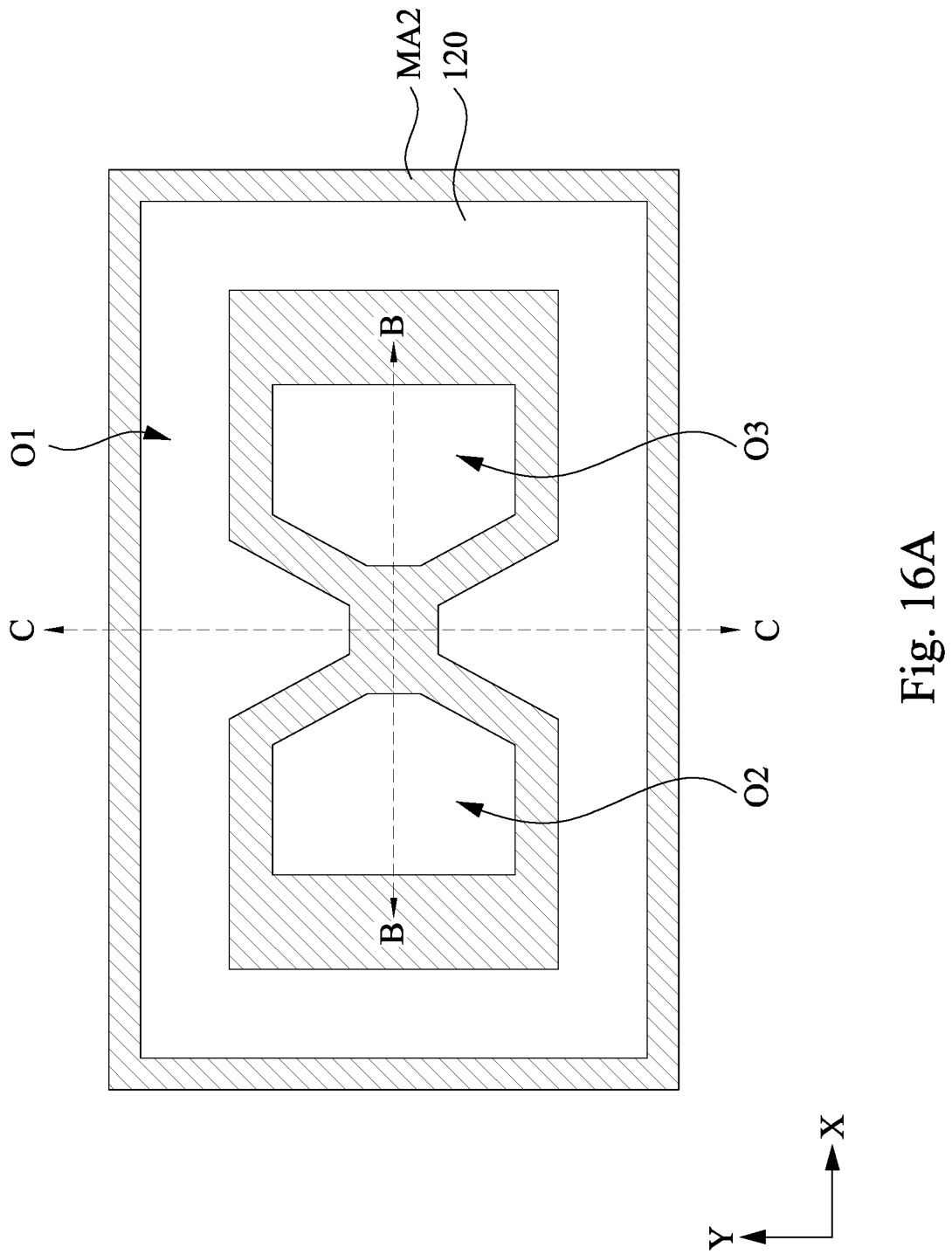
Figures 16B, 16C:
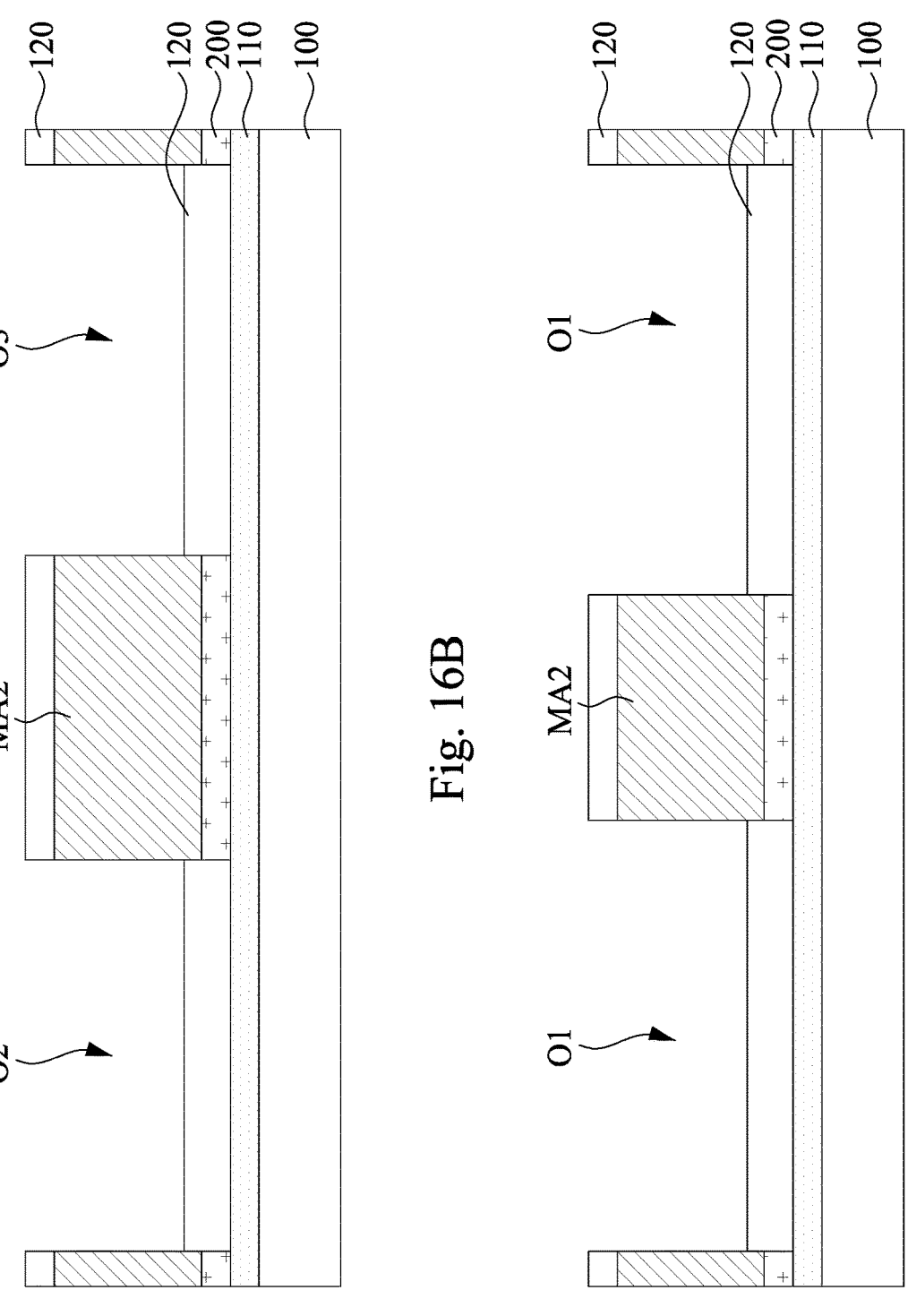

Reference is made to FIGS. 16A to 16C, in which FIG. 16A is a top view of a semiconductor device, FIG. 16B is a cross-sectional view along line B-B of FIG. 16A, and FIG. 16C is a cross-sectional view along line C-C of FIG. 16A. A contact electrode layer 120 is deposited over the patterned mask MA2 and filling the openings O1, O2, and O3. Portions of the contact electrode layer 120 in the openings O1, O2, and O3 may be in contact with top surface of the 2-D material layer 110.

In some embodiments, the contact electrode layer 120 may be formed by a physical deposition process, such as a physical vapor deposition (PVD), an e-gun evaporation deposition, or the like. In some embodiments, the contact electrode layer 120 has a higher deposition rate on a horizontal surface than on a vertical surface. Accordingly, the contact electrode layer 120 may include higher deposition rate on the top surface of the patterned mask MA2 and the top surface of the exposed 2-D material layer 110 than on the sidewalls of the patterned mask MA2. In some embodiments, portions of the contact electrode layer 120 formed in the openings O1, O2, and O3 may be in contact with sidewalls of the passivation layer 200 and sidewalls of the patterned mask MA2. In some embodiments, the portions of the contact electrode layer 120 formed in the openings O1, O2, and O3 may include higher top surfaces than the top surface of the passivation layer 200 and the bottom surface of the patterned mask MA2.

Figure 17A:
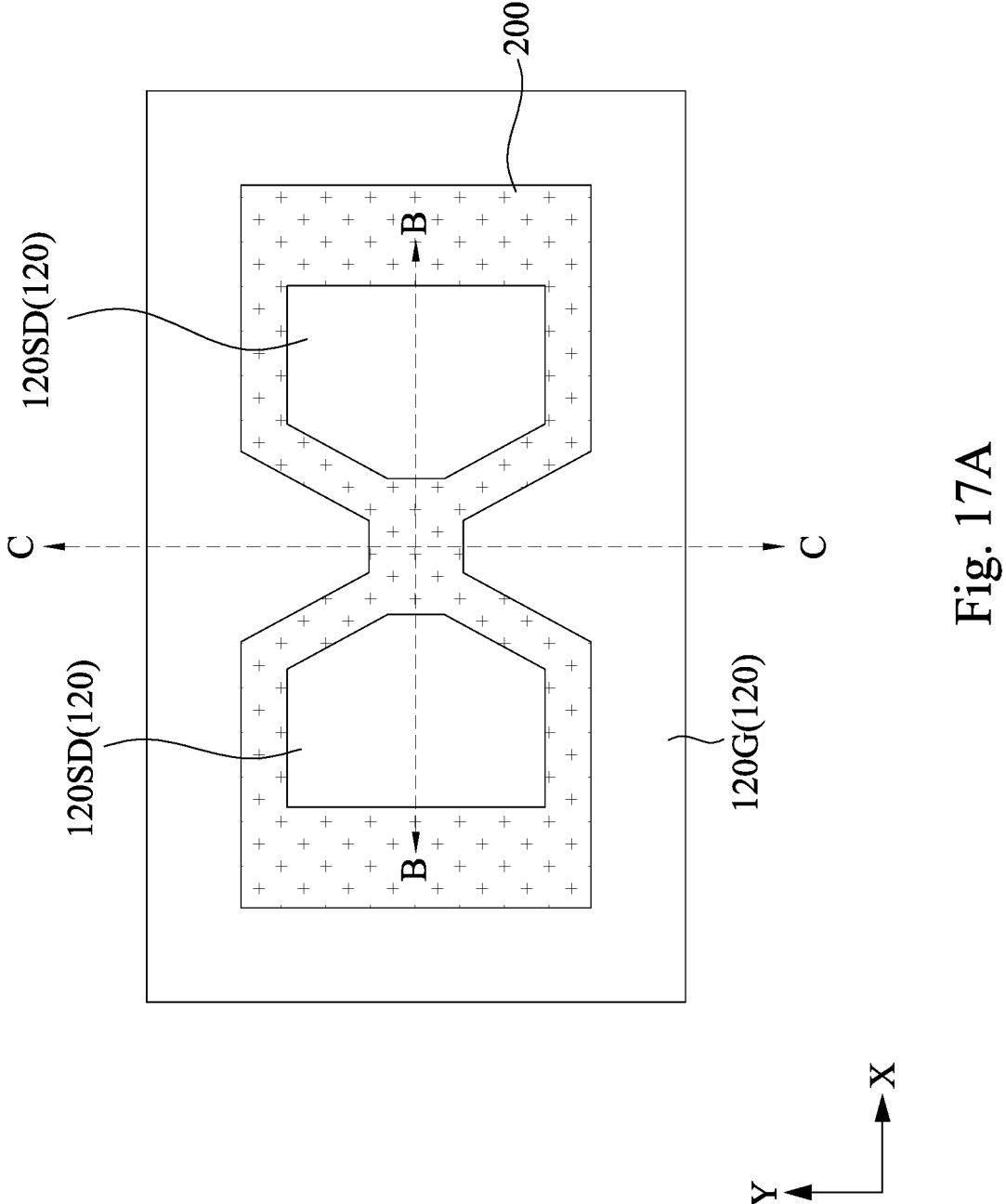
Figures 17B, 17C:
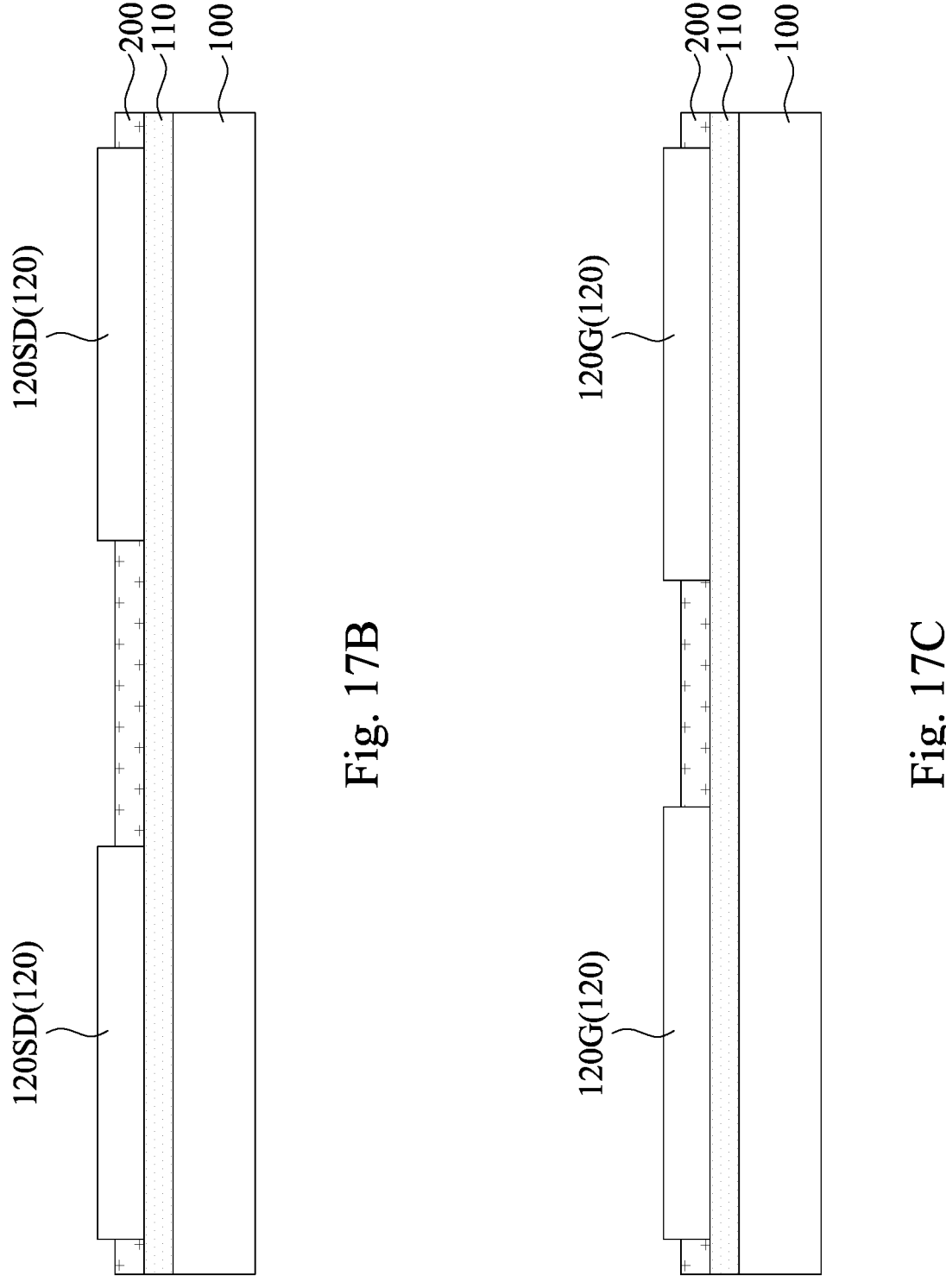

Reference is made to FIGS. 17A to 17C, in which FIG. 17A is a top view of a semiconductor device, FIG. 17B is a cross-sectional view along line B-B of FIG. 17A, and FIG. 17C is a cross-sectional view along line C-C of FIG. 17A. The patterned mask MA2 is removed, while leaving portions of the contact electrode layer 120 in the openings O1, O2, and O3 (see FIGS. 16A to 16C) remain over the 2-D material layer 110. In some embodiments where the patterned mask MA2 is made of photoresist, the patterned mask MA2 can be removed using a lift-off process. In some embodiments, portions of the contact electrode layer 120 over the top surface of the patterned mask MA2 may be removed together with the patterned mask MA2.

The contact electrode layer 120 may include a gate contact electrode 120G and source/drain contact electrodes 120SD. In some embodiments, the gate contact electrode 120G may be the portion of the contact electrode layer 120 formed in the opening O1 of the patterned mask MA2, and the source/drain contact electrodes 120SD may be the portions of the contact electrode layer 120 formed in the openings O2 and O3 of the patterned mask MA2, respectively.

Figure 18A:
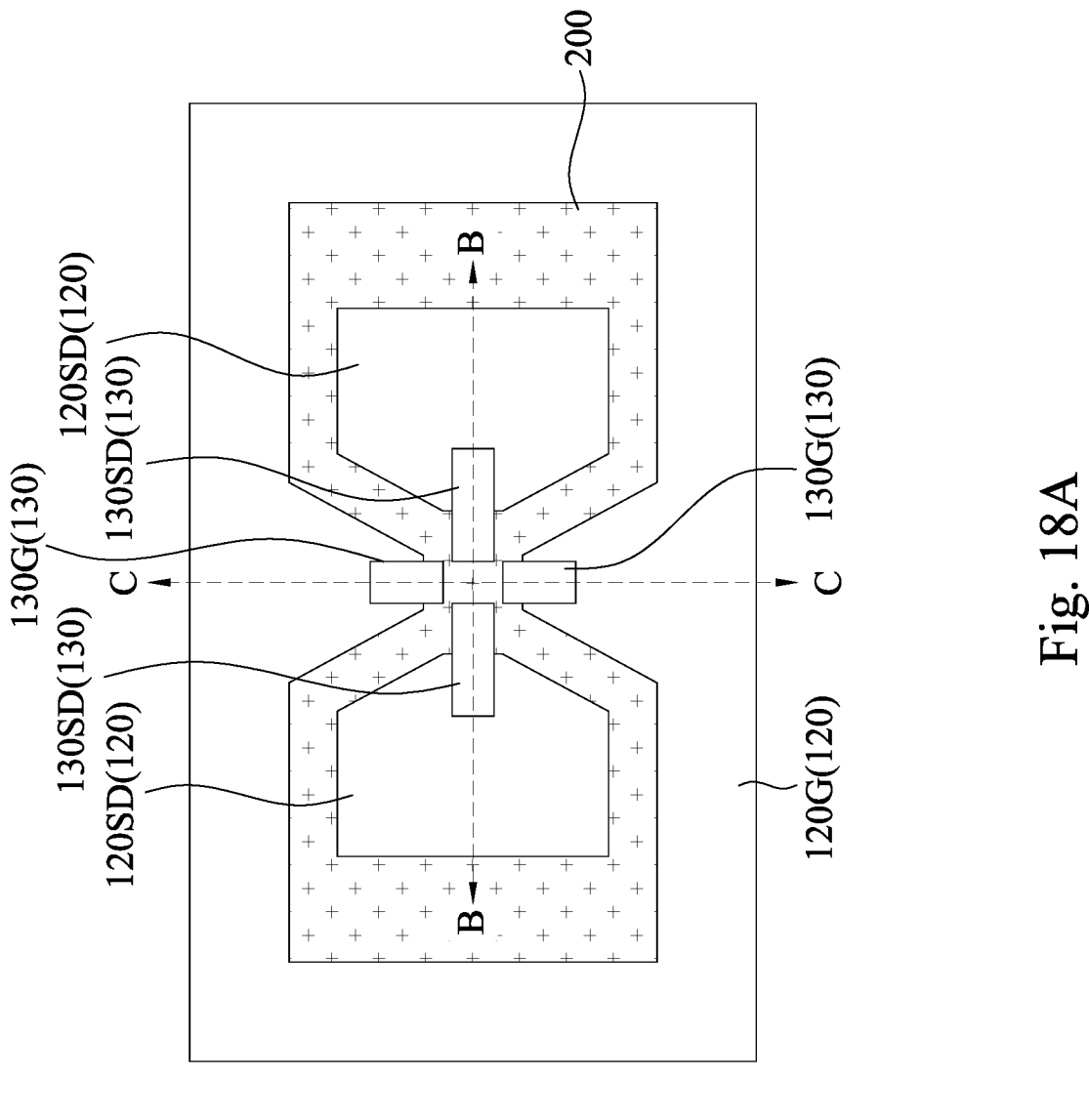
Figures 18B, 18C:
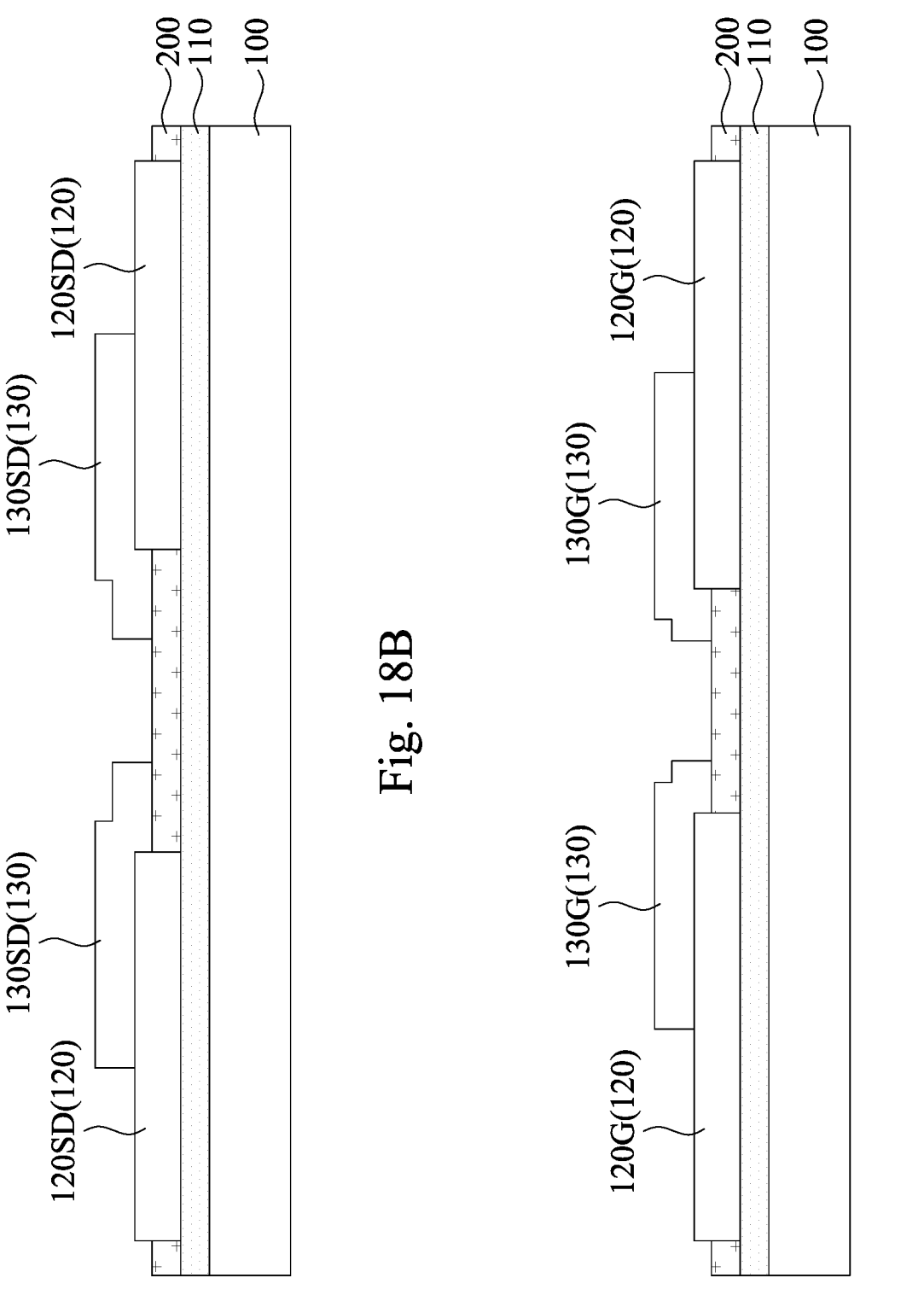

Reference is made to FIGS. 18A to 18C, in which FIG. 18A is a top view of a semiconductor device, FIG. 18B is a cross-sectional view along line B-B of FIG. 18A, and FIG. 18C is a cross-sectional view along line C-C of FIG. 18A. A metal layer 130 is deposited over the substrate 100 and covering portions of the passivation layer 200 and the contact electrode layer 120. In some embodiments, the metal layer 130 may include gate metals 130G and source/drain metals 130SD.

As shown in FIG. 18B, with respect to the source/drain metals 130SD, the bottommost surface of each of the source/drain metals 130SD is higher than the bottom surface of the source/drain contact electrode 120SD. The source/drain contact electrodes 120SD may be in contact with the 2-D material layer 110, while the source/drain metals 130SD are vertically separated from the 2-D material layer 110 through the source/drain contact electrodes 120SD and the passivation layer 200.

As shown in FIG. 18C, with respect to the gate metals 130G, the bottommost surface of each of the gate metals 130G is higher than the bottom surface of the gate contact electrode 120G. The gate contact electrode 120G may be in contact with the 2-D material layer 110, while the gate metals 130G are vertically separated from the 2-D material layer 110 through the gate contact electrode 120G and the passivation layer 200.

Figure 19A:
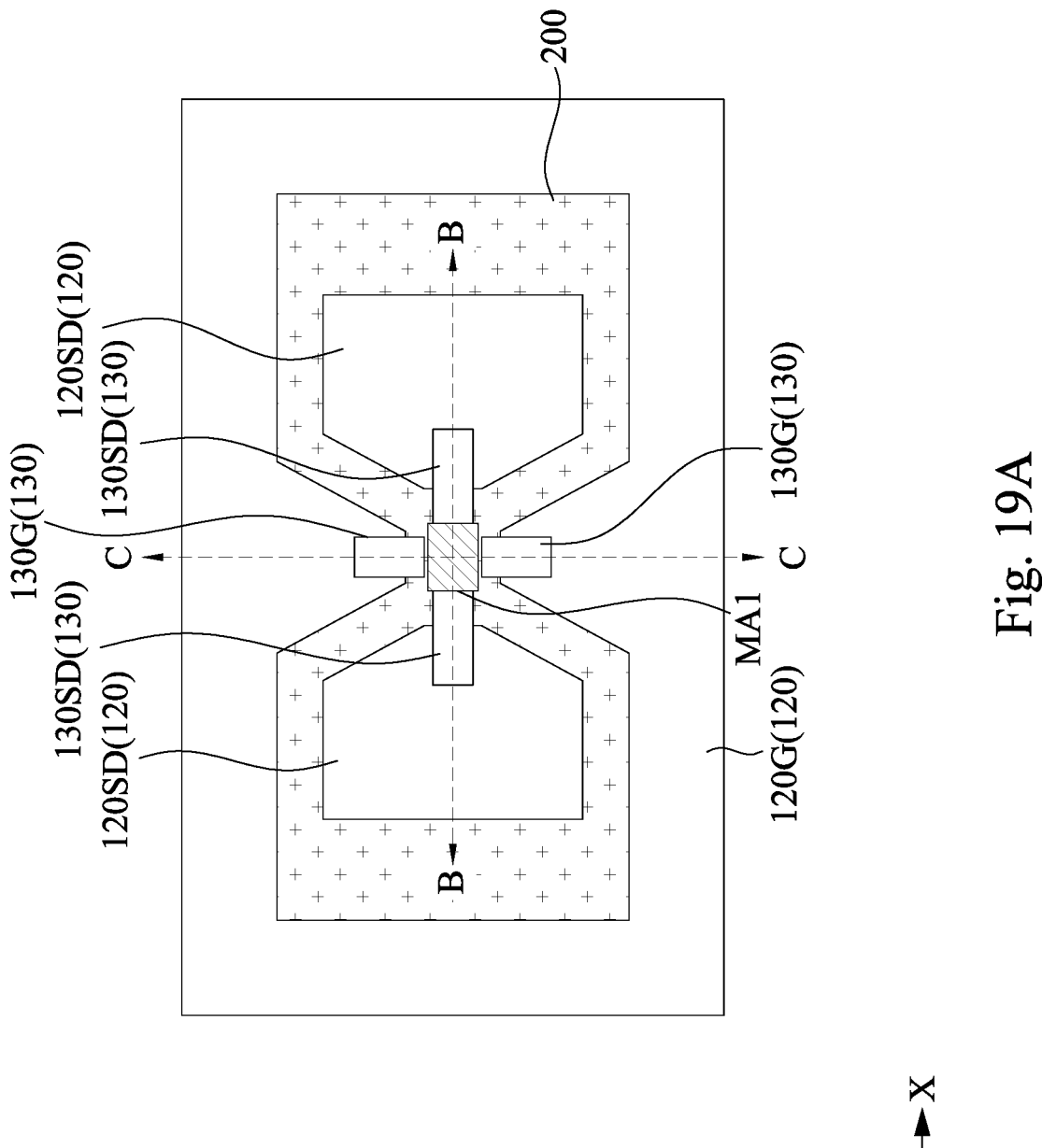
Figures 19B, 19C:
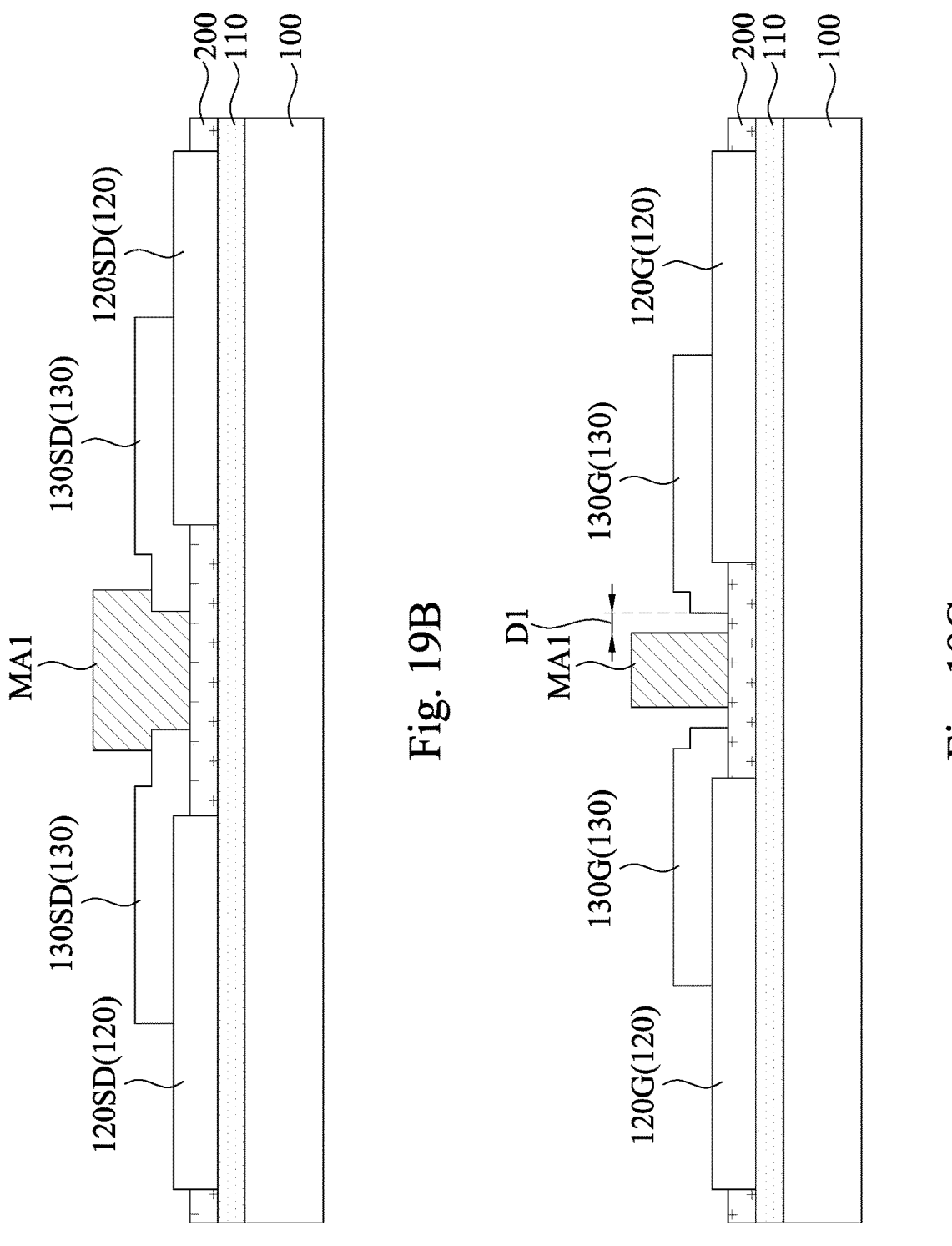

Reference is made to FIGS. 19A to 19C, in which FIG. 19A is a top view of a semiconductor device, FIG. 19B is a cross-sectional view along line B-B of FIG. 19A, and FIG. 19C is a cross-sectional view along line C-C of FIG. 19A. A patterned mask MA1 is formed over the substrate 100 and covering portions of the metal layer 130 and the passivation layer 200. As shown in the cross-section views of FIGS. 19B and 19C, the patterned mask MA1 is in contact with top surface of the passivation layer 200. In FIG. 19C, the lateral distance D1 (along the Y-direction) between the patterned mask MA1 and each gate metal 130G is in a range from about 1 nm to 300 nm.

Figure 20A:
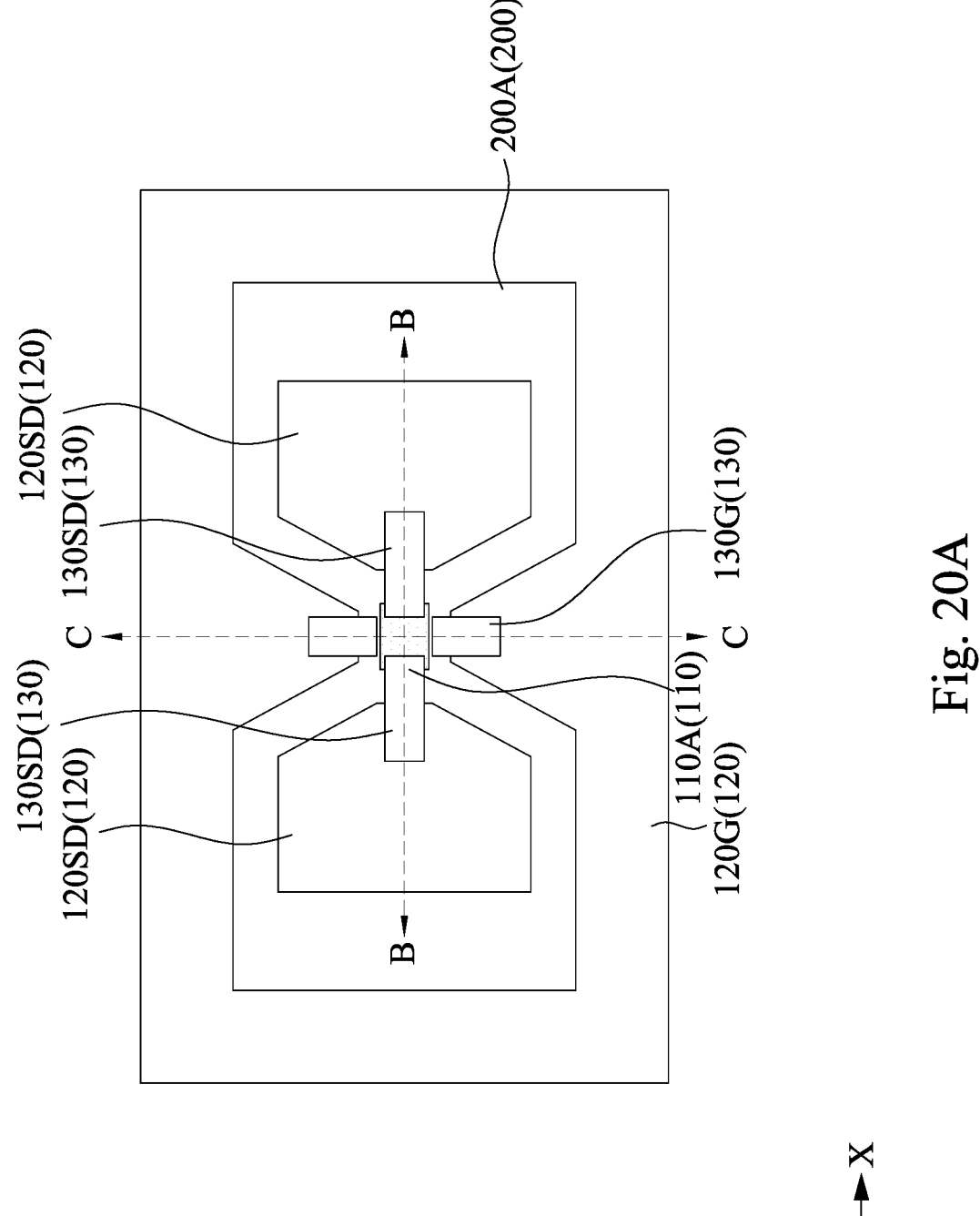
Figures 20B, 20C:
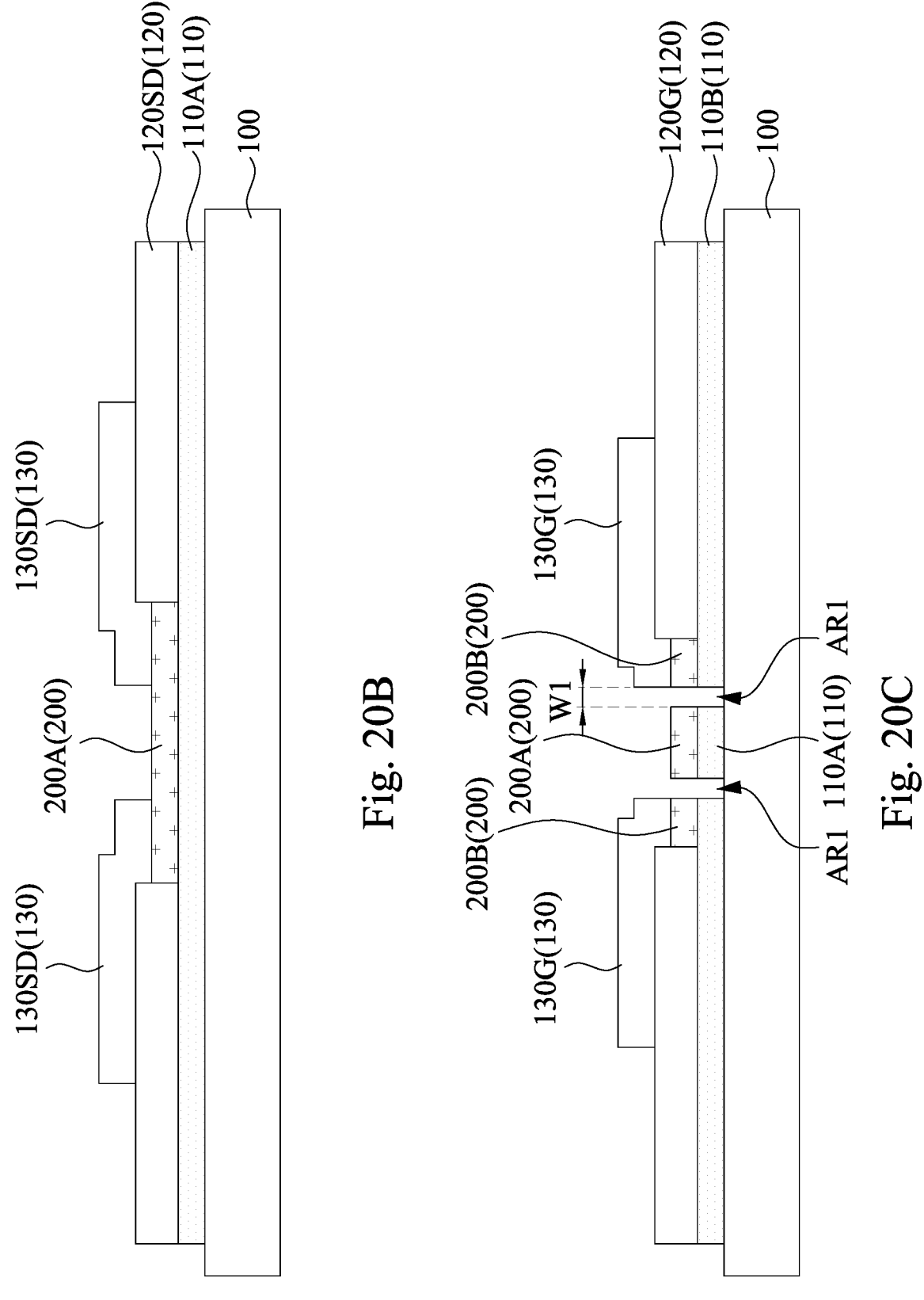

Reference is made to FIGS. 20A to 20C, in which FIG. 20A is a top view of a semiconductor device, FIG. 20B is a cross-sectional view along line B-B of FIG. 20A, and FIG. 20C is a cross-sectional view along line C-C of FIG. 20A. An etching process is performed to remove portions of the 2-D material layer 110 and the passivation layer 200 that are exposed by the patterned mask MA1, the metal layer 130, and the contact electrode layer 120. After the etching process is completed, the patterned mask MA1 is removed. In some embodiments, air gaps AR1 are formed. The lateral width W1 of the air gap AR1 (along the Y-direction) between channel region of the 2-D material layer 110A and the corresponding gate metals 130G is in a range from about 1 nm to 300 nm.

The etched passivation layer 200 may include a remaining portion 200A and a remaining portion 200B, in which the remaining portion 200A is spatially separated from the remaining portion 200B. The remaining portions 200A and 200B of the passivation layer 200 can also be referred to as passivation layers 200A and 200B.

In the cross-sectional view of FIG. 20B, the passivation layer 200A is covered at least in part by the source/drain metals 130SD. Different from the embodiments shown in FIGS. 7A to 11C, the source/drain contact electrodes 120SD are in contact with sidewalls of the passivation layer 200A, while top surface of the passivation layer 200A is free of coverage by the source/drain contact electrodes 120SD. In some embodiments, the bottom surface of the passivation layer 200A may be substantially level with the bottom surfaces of the source/drain contact electrodes 120SD.

In the cross-sectional view of FIG. 20C, the passivation layer 200B is covered by the gate metals 130G. Different from the embodiments shown in FIGS. 7A to 11C, the gate contact electrode 120G is in contact with sidewalls of the passivation layer 200B, while top surface of the passivation layer 200B is in contact with the gate metals 130G, and is free of coverage by the gate contact electrode 120G. In some embodiments, the bottom surface of the passivation layer 200B may be substantially level with the bottom surfaces of the gate contact electrode 120G.

In the embodiments of the present disclosure, when the graphene channel layer and the contact electrode layer/the metal layer (e.g., the contact electrode layer 120 and/or the metal layer 130) are separated by a passivation layer (e.g., the passivation layer 200), the interfaces between the passivation layer and the contact electrode layer/the metal layer may include high contact resistance, which may hinder the supply of carriers as the gate voltage is changed. To examine the effect of contact resistance at the electrode/passivation layer interfaces, the passivation layer beneath the contact electrodes is removed before the electrode deposition, and the resulting structure is shown in FIGS. 20A to 20C.

Figure 21:
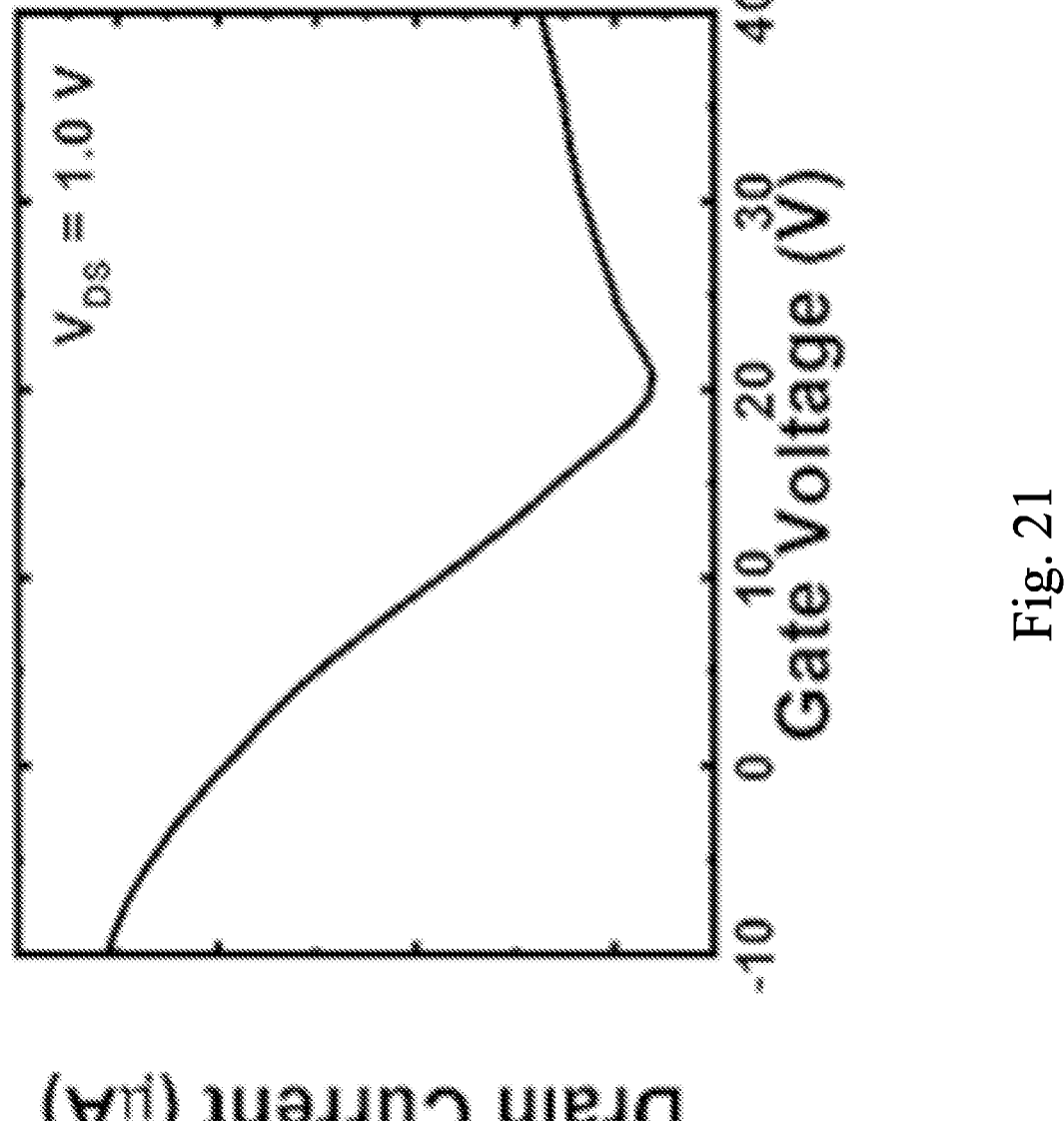
FIG. 21 is an experiment result of a semiconductor device in accordance with some embodiments of the present disclosure.

Reference is made to FIG. 21. The transfer curve of the device of FIGS. 20A to 20C at $V_{DS}=1.0$ V is shown. The Dirac point of the device is around $V_{GS}=20$ V. Also shown in the figure is a current enhancement as compared to that in FIG. 12B in the same range of gate voltage. This indicates that with the removal of $MoS_2$ beneath the electrodes, the contact resistance becomes lower. The hole mobility and electron mobility of the device are 328.0 and 187.0 $cm^2/V \cdot s$, respectively. In addition to the current enhancement due to the more significant accumulation of the carrier in the channel, the field-effect mobilities become 2 to 3 times higher than the Hall-effect ones from graphene grown on the sapphire. It is noted that the mobility extracted from the Hall measurement reflects the transport properties without altering the intrinsic carrier density of graphene on sapphire. As a result, without being screened at low-density level, the scatterings due to lattice imperfections such as charged impurities or structural defects can all impede carrier drifting. In contrast, after the issue of contact resistance is resolved, the in-plane gates may easily attract more carriers into the graphene channel. The Coulomb effect from these additionally provided carriers can screen the interactions between lattice imperfections and drifted carriers. The scattering in the channel is screened more in the presence of the higher carrier density. Therefore, by increasing the carrier density through gating, not only the drain current but also the mobility is enhanced.

Figure 22C:
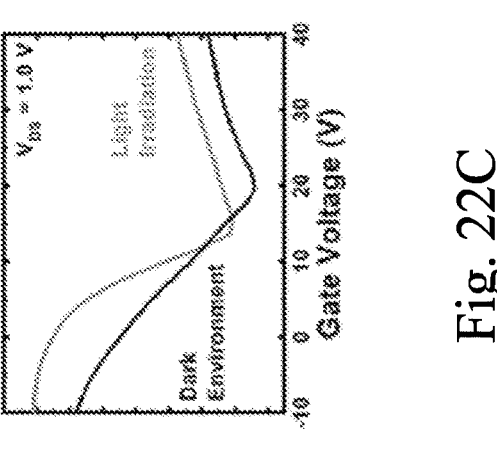
FIG. 22C is an experiment result of a semiconductor device in accordance with some embodiments of the present disclosure.
Figure 22C:
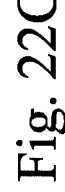
Figure 22B:
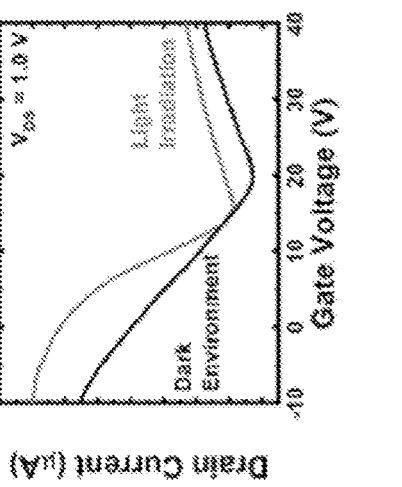
FIG. 22B is an experiment result of a semiconductor device in accordance with some embodiments of the present disclosure.
Figure 22A:
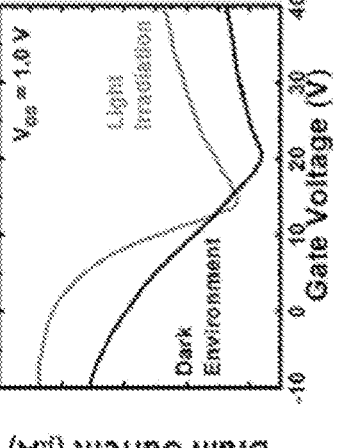
FIG. 22A is an experiment result of a semiconductor device in accordance with some embodiments of the present disclosure.

Reference is made to FIG. 22A. The transfer curves of the device of FIGS. 20A to 20C under dark and light-irradiation conditions are shown. The light source is a white light source equipped with the microscope of the probe station. The Dirac point shift from 20.0 to 15.0 V suggests that photo-excited electrons in the $MoS_2$ layer are attracted by the positive drain voltage to the graphene channel and change the Fermi level. The results revealed that with more complicated 2-D material structures such as $MoS_2$/graphene hetero-structure, different device applications such as photo-transistors can be demonstrated. The derived hole mobility and electron mobility of the device reach 1210.0 and 205.0 $cm^2/V \cdot s$, respectively, under light illumination. The increment of field-effect mobility may be also attributed to the enhanced screening effect mentioned earlier in the presence of photo-excited carriers. On the other hand, the potential of scalability and reproducibility of the device is important for practical applications.

Reference is made to FIGS. 22B and 22C. Transfer curves of two more devices of FIGS. 20A to 20C with the same device architecture under dark and light-irradiation conditions are shown. The similar device performances have demonstrated that the scalability and reproducibility of the in-plane gate graphene transistors can be achieved through the fabrication procedure as discussed in FIGS. 13A to 20C.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provide an in-plane gate transistor by using 2-D material as channel layer. The result supports the architecture of in-plane gate transistors for 2-D materials and shows the potential for abandoning gate dielectrics. Another embodiment of the present disclosure provide an in-plane gate transistor by using 2-D material as channel layer, in which a passivation layer is formed over the 2-D material channel layer. The result shows that the passivation layer can effectively protect the 2-D material channel layer from contaminants, and will further improve device performance. Yet another embodiment of the present disclosure provide an in-plane gate transistor by using 2-D material as channel layer, in which a passivation layer is formed over the 2-D material channel layer, and portions of the passivation layer is removed prior to forming the electrode layer. The result shows that removal of the passivation layer can reduce the contact resistance, and will further improve device performance.

In some embodiments of the present disclosure, a semiconductor device includes a substrate. A 2-D material channel layer is over the substrate, in which the 2-D material channel layer includes a channel region and source/drain regions on opposite sides of the channel region. Source/drain metals are over of the source/drain regions of the 2-D material channel layer. A gate metal is over the substrate and non-overlapping the 2-D material channel layer along a vertical direction, in which the gate metal is laterally separated from the 2-D material channel layer by an air gap.

In some embodiments, the semiconductor device further includes a 2-D material layer in contact with a top surface of the substrate and a bottom surface of the gate metal.

In some embodiments, the 2-D material channel layer and the 2-D material layer are made of a same material.

In some embodiments, the semiconductor device further includes a 2-D material passivation layer in contact with a top surface of the 2-D material channel layer, in which the 2-D material passivation layer and the 2-D material channel layer are made of different 2-D materials.

In some embodiments, the 2-D material channel layer is made of a conductive 2-D material and the 2-D material passivation layer is made of a less conductive 2-D material.

In some embodiments, the semiconductor device further includes source/drain contact electrodes over the source/drain regions of the 2-D material channel layer, in which each of the source/drain metals extends from a top surface of a corresponding one of the source/drain contact electrodes to a sidewall of the corresponding one of the source/drain contact electrodes. A gate contact electrode is over the substrate, in which the gate metal extends from a top surface of the gate contact electrode to a sidewall of the gate contact electrode.

In some embodiments, a lateral width of the air gap between the 2-D material channel layer and the gate metal is from about 1 nm to 300 nm.

In some embodiments of the present disclosure, a semiconductor device includes a substrate. A 2-D material channel layer is over the substrate, in which the 2-D material channel layer includes a channel region and source/drain regions on opposite sides of the channel region. A 2-D material passivation layer has a first portion covering a top surface of the 2-D material channel layer. Source/drain contact electrodes are over of the source/drain regions of the 2-D material channel layer. A gate contact electrode is over the substrate and non-overlapping the 2-D material channel layer along a vertical direction.

In some embodiments, the 2-D material channel layer is made of graphene, and the 2-D material passivation layer is made of transition metal dichalcogenides.

In some embodiments, the first portion of the first portion is in contact with sidewalls of the source/drain contact electrodes.

In some embodiments, the source/drain contact electrodes are in contact with a top surface of the 2-D material channel layer.

In some embodiments, the 2-D material passivation layer having a second portion in contact with a sidewall of the gate contact electrode, and the first portion of the 2-D material passivation layer is laterally separated from the second portion of the 2-D material passivation layer.

In some embodiments, the semiconductor device further includes a 2-D material layer between the substrate and the gate contact electrode, in which the 2-D material layer is laterally separated from the 2-D material channel layer.

In some embodiments, the 2-D material layer is laterally separated from the 2-D material channel layer by an air gap.

In some embodiments of the present disclosure, a method includes forming a 2-D material layer over a substrate; forming a gate contact electrode and source/drain contact electrodes over the 2-D material layer; forming a first patterned mask covering a channel region of the 2-D material layer, in which the first patterned mask non-overlaps the gate contact electrode along a vertical direction; etching portions of the 2-D material layer uncovered by the first patterned mask, such that the channel region of the 2-D material layer is laterally separated from the gate contact electrode; and removing the first patterned mask.

In some embodiments, the method further includes forming a 2-D material passivation layer over the 2-D material layer prior to forming the gate contact electrode and the source/drain contact electrodes.

In some embodiments, forming the gate contact electrode and the source/drain contact electrodes includes forming a second patterned mask over the 2-D material passivation layer, in which the second patterned mask includes openings exposing the 2-D material passivation layer; and depositing a conductive material in the openings of the second patterned mask, in which the method further includes etching the 2-D material passivation layer through the openings of the second patterned mask prior to depositing the conductive material.

In some embodiments, the method further includes forming a gate metal extending from a top surface of the gate contact electrode to a sidewall of the gate contact electrode, in which a lateral distance between the gate metal and the channel region of the 2-D material layer is less than a lateral distance between the gate contact electrode and the channel region of the 2-D material layer.

In some embodiments, the first patterned mask non-overlaps the gate metal along the vertical direction.

In some embodiments, the 2-D material layer includes a remaining portion under the gate contact electrode after etching the portions of the 2-D material layer, in which the remaining portion of the 2-D material layer is laterally separated from the channel region of the 2-D material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a 2-D material layer over a substrate;
forming a gate contact electrode and source/drain contact electrodes over the 2-D material layer;
forming a gate metal extending from a top surface of the gate contact electrode to a sidewall of the gate contact electrode;
forming a first patterned mask covering a channel region of the 2-D material layer, wherein the first patterned mask non-overlaps the gate contact electrode along a vertical direction;
etching portions of the 2-D material layer uncovered by the first patterned mask, such that the channel region of the 2-D material layer is laterally separated from the gate contact electrode and the gate metal, wherein a lateral distance between the gate metal and the channel region of the 2-D material layer is less than a lateral distance between the gate contact electrode and the channel region of the 2-D material layer; and
removing the first patterned mask.

2. The method of claim 1, further comprising forming a 2-D material passivation layer over the 2-D material layer prior to forming the gate contact electrode and the source/drain contact electrodes.

3. The method of claim 1, wherein the first patterned mask non-overlaps the gate metal along the vertical direction.

4. The method of claim 1, wherein the 2-D material layer comprises a remaining portion under the gate contact electrode after etching the portions of the 2-D material layer, wherein the remaining portion of the 2-D material layer is laterally separated from the channel region of the 2-D material layer.

5. The method of claim 1, wherein the 2-D material layer comprises graphene.

6. A method, comprising:
forming a 2-D material layer over a substrate;
forming a gate contact electrode and source/drain contact electrodes over the 2-D material layer;
forming a metal layer over the 2-D material layer, wherein the metal layer comprises source/drain metals and a gate metal, wherein the gate metal extends from a top surface of the gate contact electrode to a sidewall of the gate contact electrode; and patterning the 2-D material layer to define a channel region of the 2-D material layer between the source/drain metals in a first cross-sectional view, wherein the gate metal does not overlap the channel region of the 2-D material layer in the first cross-sectional view, and wherein in a second cross-sectional view that is perpendicular to the first cross-sectional view, a lateral distance between the gate metal and the channel region of the 2-D material layer is less than a lateral distance between the gate contact electrode and the channel region of the 2-D material layer.

7. The method of claim 6, further comprising depositing a passivation layer over the 2-D material layer prior to forming the metal layer.

8. The method of claim 7, wherein the passivation layer is made of a 2-D material.

9. The method of claim 7, wherein the passivation layer and the 2-D material layer are made of different 2-D materials.

10. The method of claim 6, wherein patterning the 2-D material layer comprises removing a portion of the 2-D material layer, such that in the second cross-sectional view, the channel region of the 2-D material layer is spaced apart from a remaining portion of the 2-D material layer under the gate metal through an air gap.

11. The method of claim 10, wherein in the second cross-sectional view the gate metal is spaced apart from the channel region of the 2-D material layer by a non-zero distance.

12. The method of claim 10, wherein the air gap exposes a top surface of the substrate.

13. The method of claim 6, wherein the 2-D material layer comprises graphene.

14. A method, comprising:
forming a 2-D material layer over a substrate;
forming a 2-D material passivation layer over the 2-D material layer
forming an electrode layer over the 2-D material passivation layer, the electrode layer comprising source/drain contact electrodes and a gate contact electrode;
forming a metal layer over the 2-D material layer, wherein the metal layer comprises source/drain metals and a gate metal, wherein the gate metal extends from a top surface of the gate contact electrode to a sidewall of the gate contact electrode; and
patterning the 2-D material layer and the 2-D material passivation layer to define a channel region of the 2-D material layer between the source/drain metals in a first cross-sectional view, in a second cross-sectional view that is perpendicular to the first cross-sectional view, the 2-D material passivation layer having a first portion covering a top surface of the channel region of the 2-D material layer, and a second portion below the gate contact electrode, and the first portion is spaced apart from the second portion, and wherein in the second cross-sectional view, a lateral distance between the gate metal and the channel region of the 2-D material layer is less than a lateral distance between the gate contact electrode and the channel region of the 2-D material layer.

15. The method of claim 14, wherein the 2-D material passivation layer and the 2-D material layer are made of different materials.

16. The method of claim 14, wherein patterning the 2-D material layer and the 2-D material passivation layer comprises:

forming a mask covering the first portion of the 2-D material passivation layer; and etching the 2-D material layer and the 2-D material passivation layer to expose a top surface of the substrate.

17. The method of claim 14, wherein in the second cross-sectional view the gate contact electrode does not overlap the first portion of the 2-D material passivation layer.

18. The method of claim 14, wherein in the second cross-sectional view the gate contact electrode is spaced apart from the channel region of the 2-D material layer by a non-zero distance.

19. The method of claim 14, wherein the gate contact electrode is absent in the first cross-sectional view.

20. The method of claim 14, wherein the 2-D material passivation layer is made of transition metal dichalcogenide (TMD).

* * * * *